United States Patent
Yang

(10) Patent No.: US 10,186,543 B2
(45) Date of Patent: Jan. 22, 2019

(54) IMAGE SENSOR INCLUDING PHASE DIFFERENCE DETECTORS

(71) Applicant: SK hynix Inc., Gyeonggi-do (KR)

(72) Inventor: Yun-Hui Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 96 days.

(21) Appl. No.: 15/437,716

(22) Filed: Feb. 21, 2017

(65) Prior Publication Data

US 2017/0365635 A1    Dec. 21, 2017

(30) Foreign Application Priority Data

Jun. 21, 2016 (KR) .................. 10-2016-0077105

(51) Int. Cl.
*H01L 27/146* (2006.01)

(52) U.S. Cl.
CPC .. *H01L 27/14643* (2013.01); *H01L 27/14601* (2013.01); *H01L 27/14609* (2013.01); *H01L 27/14621* (2013.01); *H01L 27/14625* (2013.01)

(58) Field of Classification Search
CPC ............. H01L 27/30; H01L 31/02016; H01L 31/0248
See application file for complete search history.

(56) References Cited

U.S. PATENT DOCUMENTS

2015/0162375 A1 * 6/2015 Torii ................ H01L 27/14636
                                                                      438/73
2016/0044229 A1    2/2016 Hamada

* cited by examiner

*Primary Examiner* — Cheung Lee
(74) *Attorney, Agent, or Firm* — IP & T Group LLP

(57) ABSTRACT

An image sensor may include a main photodiode formed in a substrate, a first inter-layer dielectric layer formed over a lower surface of the substrate, and phase difference detectors formed over the first inter-layer dielectric layer. The phase difference detectors include a left phase difference detector that is vertically overlapping and aligned with a left side region of the main photodiode, and a right phase difference detector that is vertically overlapping and aligned with a right side region of the main photodiode.

20 Claims, 48 Drawing Sheets

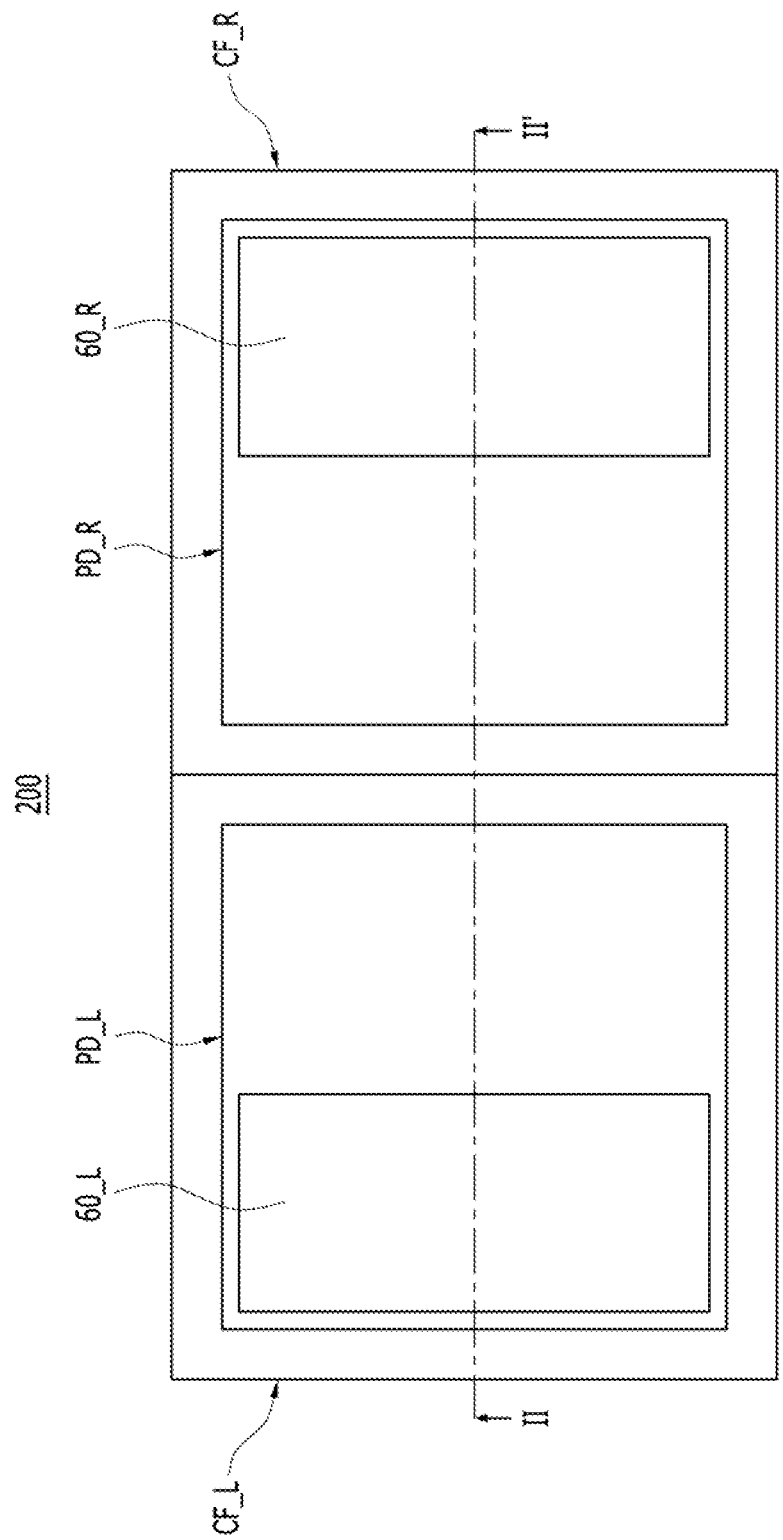

IMAGE SENSOR INCLUDING PHASE DIFFERENCE DETECTORS

CROSS-REFERENCE TO RELATED APPLICATIONS

The present application claims priority to Korean Patent Application No. 10-2016-0077105, filed on Jun. 21, 2016, which is herein incorporated by reference in its entirety.

BACKGROUND

1. Field

Exemplary embodiments of the present invention provide image sensors including phase difference detectors.

2. Description of the Related Art

An image sensor is a device that converts an optical image into electrical signals. Recently, as the computer industry and communication industry advance, demand for image sensors with high integration degree and improved performance is increasing in a wide variety of areas such as digital cameras, camcorders, Personal Communication Systems (PCS), game players, security surveillance cameras, medical micro cameras, robots and the like. Particularly, auto-focusing technology that detects a phase difference of light is under development.

SUMMARY

Embodiments of the present invention provide image sensors including pixels each of which is provided with phase difference detectors. Embodiments of the present invention provide image sensors including pixel pairs each of which is provided with phase difference detectors.

Embodiments of the present invention provide a method for fabricating image sensors that include pixels each of which is provided with phase difference detectors.

Besides the objectives of the embodiments of the present invention described above, there may be other diverse objectives of the embodiments of the present invention, which may be obvious to and understood by those skilled in the art to which the present invention pertains from the following description.

In accordance with an embodiment of the present invention, an image sensor may include a main photodiode formed in a substrate, a first inter-layer dielectric layer formed over a lower surface of the substrate, and phase difference detectors formed over the first inter-layer dielectric layer. The phase difference detectors include a left phase difference detector that is vertically overlapping and aligned with a left side region of the main photodiode, and a right phase difference detector that is vertically overlapping and aligned with a right side region of the main photodiode.

The phase difference detectors may include a left bottom electrode, a left buried photodiode, and a left top electrode. The right phase difference detector may include a right bottom electrode, a right buried photodiode, and a right top electrode.

Each of the bottom electrodes may include metal.

Each of the buried photodiodes may include a PIN photodiode.

Each of the buried photodiodes may have a curved upper surface.

Each of the left and right top electrodes may include a transparent conductor.

Each of the left and right top electrodes may include a rim shape or a frame shape in a top view.

Each of the top left and right electrodes may have a shape of parallel bars or a shape of islands in a top view.

The image sensor may further include a left light guide formed in the first inter-layer dielectric layer vertically overlapping and aligned with the left phase difference detector, and a right light guide formed in the first inter-layer dielectric layer vertically overlapping and aligned with the right phase difference detector.

Each of the left and right light guides may include a material having a higher refractive index than the first inter-layer dielectric layer.

The image sensor may further include a left guide dam formed between the main photodiode and the left phase difference detector vertically overlapping and aligned with the left phase difference detector, and a right guide dam formed between the main photodiode and the right phase difference detector vertically overlapping and aligned with the right phase difference detector.

Each of the left and right guide dais may include a rim shape or a frame shape in a top view.

Each of the left and right guide dams may include an air gap.

Each of the guide dams may include a material having a lower refractive index than the first inter-layer dielectric layer.

In accordance with another embodiment of the present invention, an image sensor may include a left main photodiode and a right main photodiode that are formed in a substrate, a first inter-layer dielectric layer formed over a lower surface of the substrate, and phase difference detectors disposed over the first inter-layer dielectric layer. The phase difference detectors may include a left phase difference detector that is vertically overlapping and aligned with the left main photodiode, and a right phase difference detector that is vertically overlapping and aligned with the right main photodiode.

The left phase difference detector may include a left bottom electrode, a left buried photodiode and a left top electrode. The right phase difference detector may include a right bottom electrode, a right buried photodiode, and a right top electrode.

The image sensor may further include a left light guide that is vertically overlapping and aligned with a left side region of the left main photodiode and the left phase difference detector, and a right light guide that is vertically overlapping and aligned with a right side region of the right main photodiode and the right phase difference detector.

In accordance with yet another embodiment of the present invention, an image sensor may include a main photodiode formed in a substrate, a color filter formed over an upper surface of the substrate, a first inter-layer dielectric layer formed over a lower surface of the substrate, and a buried photodiode formed over the first inter-layer dielectric layer. The buried photodiode is vertically overlapping the main photodiode and aligned with a first sidewall of the main photodiode.

The image sensor may further include a bottom electrode formed between the buried photodiode and the first inter-layer dielectric layer, and a top electrode formed over the buried photodiode. The bottom electrode includes an opaque conductor. The top electrode includes a transparent conductor.

The buried photodiode may include a stack of an N-type region, an intrinsic region, and a P-type region. Each of the N-type region, the intrinsic region, and the P-type region is formed of amorphous silicon or polycrystalline silicon.

BRIEF DESCRIPTION OF THE DRAWINGS

FIG. 4 is a layout of a pair of pixels of an image sensor in accordance with an embodiment of the present invention.

DETAILED DESCRIPTION

Figure 1:
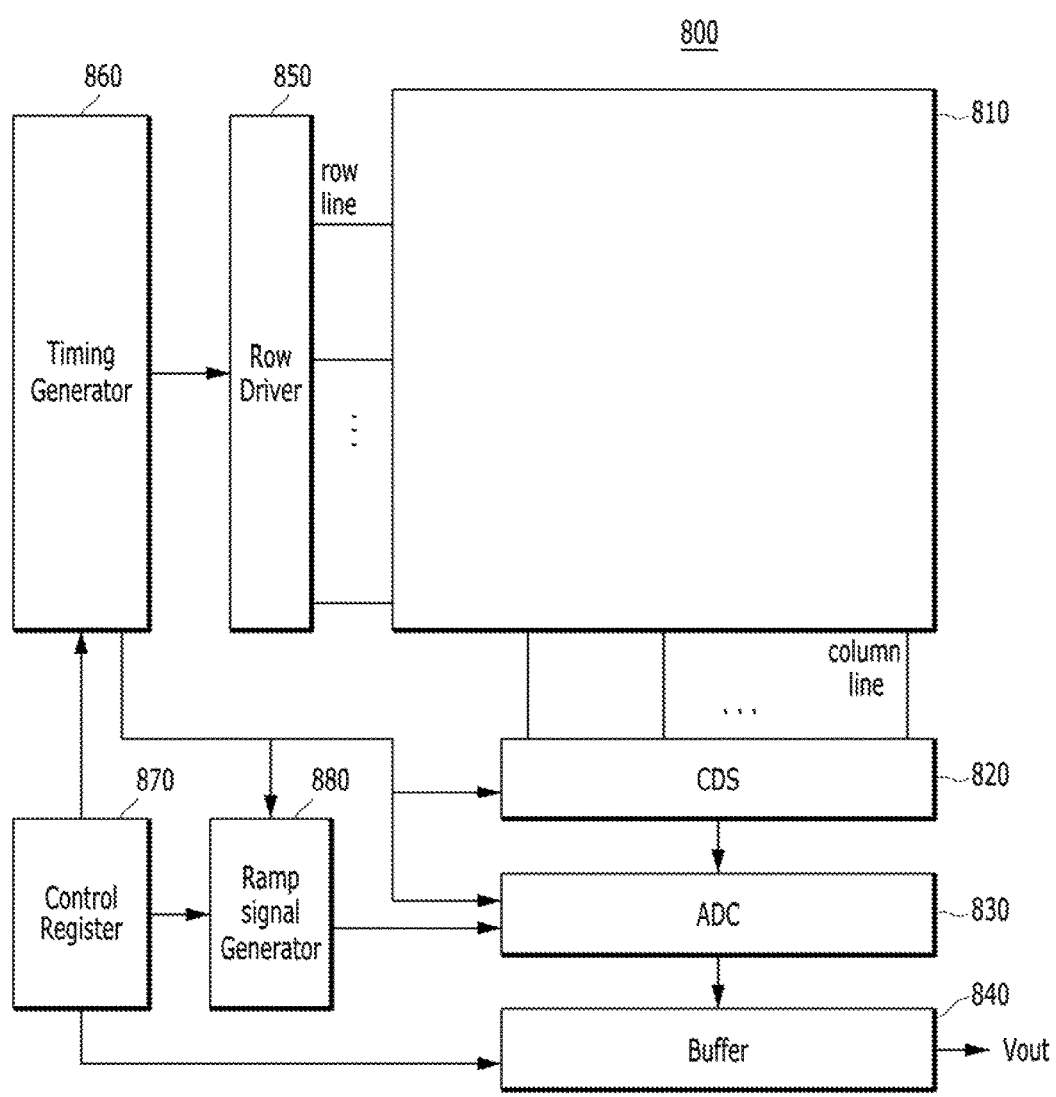
FIG. 1 is a block diagram illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided to make this disclosure thorough and complete, and fully convey the scope of the present invention to those skilled in the art. The spirit and scope of the invention are as defined in the claims.

The terms used in this patent specification are for describing the embodiments of the present invention and they do not limit the scope of the present invention. In this specification, the use of a singular term includes a plural term as well unless mentioned otherwise. The use of an expression 'comprises' and/or 'comprising' a constituent element, step, and/or device in this patent specification does not exclude the presence or addition of another constituent element, step, and/or device.

When an element is described in this specification to be 'connected to' or 'coupled to' another element, the description includes not only a direct connection or coupling but also an indirect connection or coupling where yet another element is interposed between them. On the other hand, when an element is described to be 'directly connected to' or 'directly coupled to' another element, the description means that there are no other elements interposed between them. The expression 'and/or' includes each of the mentioned items, and all combinations of one or more of the mentioned items.

When a first layer is referred to as being "on" a second layer or "on" a substrate, it not only refers to a case in which the first layer is formed directly on the second layer or the substrate but also a case in which a third layer exists between the first layer and the second layer or the substrate.

The terms 'below', 'beneath', 'lower', 'above', and 'upper' are spatially relative words, and they may be used to easily describe the correlation between an element or constituent element and another element or constituent element in the drawings. The spatially relative words have to be construed to include not only the direction illustrated in the drawings but also includes different directions when the element is used or operates. For example when a drawing is reversed, an element that is described to be 'below' or 'beneath' of another element may be disposed above the element.

Also, the embodiments of the present invention described in this specification are described with reference to the exemplary drawings which are cross-sectional views and/or plane views. The drawings are not necessarily to scale and in some instances, proportions may have been exaggerated to clearly illustrate features of the embodiments. Therefore, the forms of the exemplary drawings may be changed due to a fabrication method and/or tolerance. In this respect, the embodiments of the present invention are not limited to the specific forms illustrated in the drawings, but include a variation in the shape formed according to the fabrication process. For example, a region illustrated to have a right angle may be of a shape having a rounded portion or a predetermined curvature. Therefore, the regions shown in the drawings are roughly illustrated, and the shapes of the regions exemplarily illustrated in the drawings just show specific shapes of the regions of an element and the shapes do not limit the scope of the present invention.

Throughout the disclosure, like reference numerals refer to like parts throughout the various figures and embodiments of the present invention. Therefore, the reference numerals may be referred to and described, although they are not mentioned and/or described in the corresponding drawing. Also, even though a reference numeral does not appear in the corresponding drawing, the constituent element of the reference numeral may be described by referring to other drawings.

FIG. 1 is a block diagram illustrating an image sensor 800 in accordance with an embodiment of the present invention. Referring to FIG. 1, the image sensor 800 may include a pixel array 810 including a plurality of pixels that are arranged in a matrix structure, a correlated double sampler (CSS) 820, an analog-to-digital converter (ADC) 830, a buffer 840, a row driver 850, a timing generator 860, a control register 870, and a ramp signal generator 880.

The pixel array 810 may include a plurality of pixels that are arranged in a matrix structure. The pixels may convert optical image data into electrical image signals and transfer the electrical image signals to the correlated double sampler 820 through column lines. Each of the pixels may be coupled to one row line among a plurality of row lines and one column line among a plurality of column lines.

The correlated double sampler 820 may hold and sample the electrical image signals that are received from the pixels of the pixel array 810. For example, the correlated double sampler 820 may sample the voltage level of the received electrical image signals with a reference voltage level based on a dock signal that is supplied by the timing generator 860, and transfer an analog signal corresponding to the voltage level difference to the analog-to-digital converter 830. The analog-to-digital converter 830 may convert the received analog signal into digital signals and transfer the digital signals to the buffer 840.

The buffer 840 then may latch the received digital signals, and sequentially output the latched digital signals to an image signal processor (not shown). The buffer 840 may include a memory for latching the digital signals and a sense amplifier for amplifying the digital signals. The row driver 850 may drive some pixels of the pixel array 810 based on a signal of the timing generator 860. For example, the row driver 850 may select one row line among a plurality of row lines and generate a driving signal which drives the selected row line. The timing generator 860 may generate timing signals for controlling the correlated double sampler 820, the analog-to-digital converter 830, the row driver 850, and the ramp signal generator 880.

The control register 870 may generate control signals for controlling the buffer 840, the timing generator 860, and the ramp signal generator 880. The ramp signal generator 880 may generate a ramp signal for controlling the mage signal outputted from the buffer 840 under the control of the timing generator 860.

Figure 2:
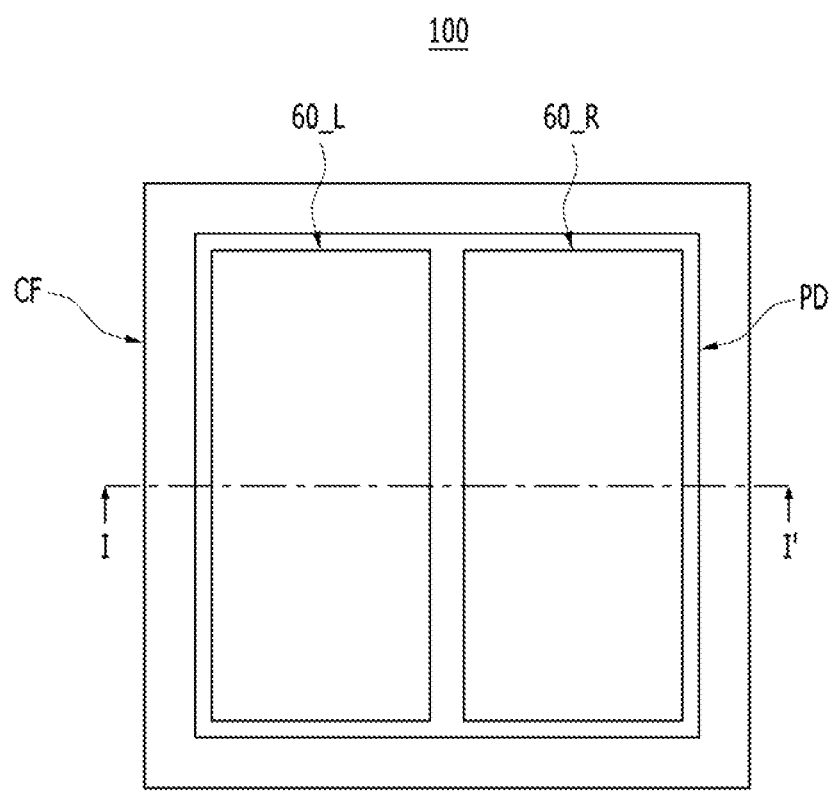
FIG. 2 is a layout of a pixel of an image sensor in accordance with an embodiment of the present invention.

FIG. 2 is a layout of a pixel 100 of an image sensor in accordance with an embodiment of the present invention. FIGS. 3A to 3F are horizontal cross-sectional views taken along the line I-I' of FIG. 2. Referring to FIG. 2, the pixel 100 of the image sensor in accordance with the embodiment of the present invention may include a main photodiode PD, phase difference detectors 60_L and 60_R, and a color filter CF.

The phase difference detectors 60_L and 60_R may include a left phase difference detector 60_L and a right phase difference detector 60_R. The left phase difference detector 60_L may overlap left-side regions of the main photodiode PD and the color filter CF, whereas the right phase difference detector 60_R may overlap right-side regions of the main photodiode PD and the color filter CF. In some embodiments of the present invention, the left phase difference detector 60_L and the right phase difference detector 60_R may be construed as a top phase difference detector and a bottom phase difference detector.

Since the pixel 100 in accordance with the embodiment of the present invention has the phase difference detectors 60_L and 60_R that are disposed to the left side and to the right side, the pixel 100 may be used as a phase-detecting pixel. Specifically, the left phase difference detector 60_L may analyze the intensity of light that enters at a slanted angle from the right top, and the right phase difference detector 60_R may analyze the intensity of light that enters at a slanted angle from the left top. Accordingly, the image sensor in accordance with the embodiment of the present invention may detect a phase difference of light and realize an auto-focus function even with one pixel 100.

Figure 3A:
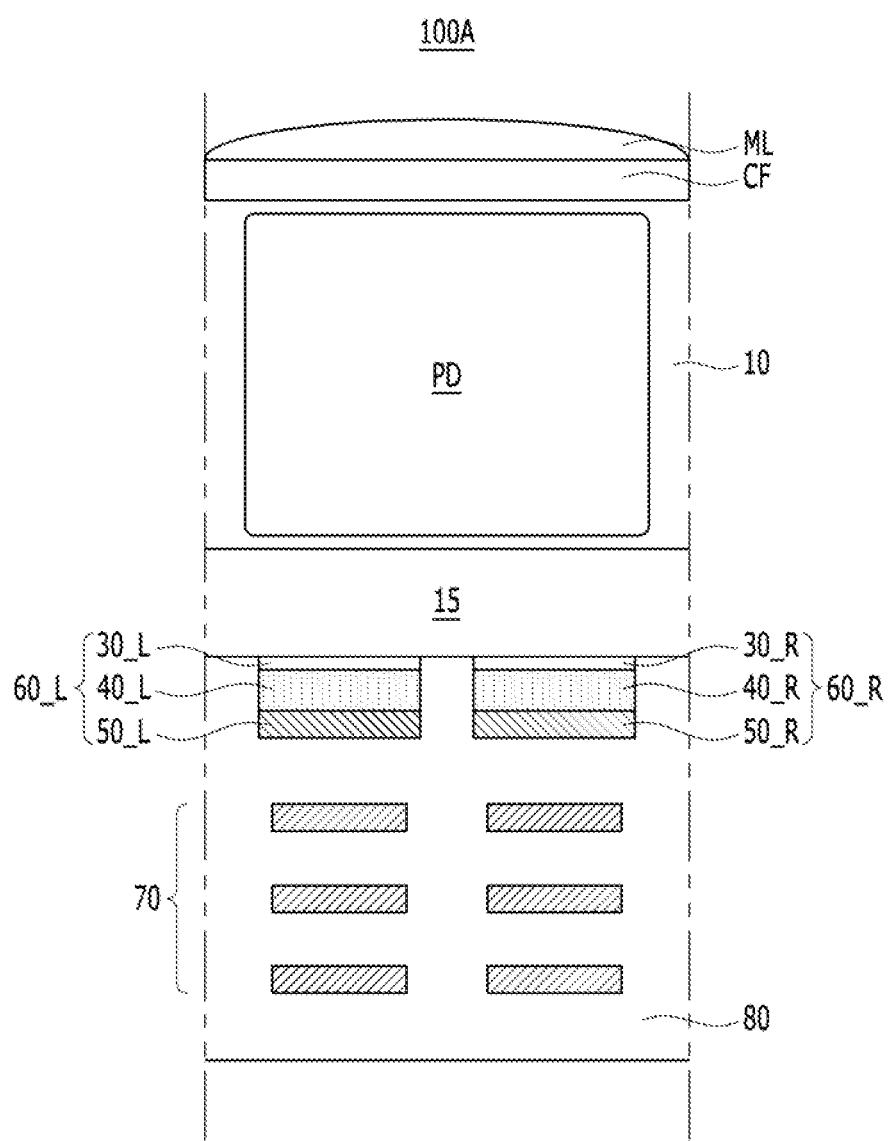
FIGS. 3A to 3F are horizontal cross-sectional views taken along the line I-I'0 of FIG. 2 to describe various pixels of image sensors in accordance with embodiments of the present invention.

FIGS. 3A to 3F are horizontal cross-sectional views of various pixels 100A to 100F of image sensors in accordance with embodiments of the present invention. Referring to FIG. 3A, a pixel 100A of an image sensor in accordance with an embodiment of the present invention may include a main photodiode PD formed in a substrate 10, a color filter CF and a micro lens ML that are stacked over the upper surface of the substrate 10, a first inter-layer dielectric layer 15 that is disposed under the lower surface of the substrate 10, phase difference detectors 60_L and 60_R, multiple layers of metal lines 70, and a second inter-layer dielectric layer 80.

The substrate 10 may include a single-crystalline silicon wafer or an epitaxially grown single-crystalline silicon layer. The main photodiode PD may include a P-type region which includes P-type impurity ions and an N-type region includes N-type impurity ions that are doped inside the substrate 10. The color filter CF and the micro lens ML may include an organic polymeric material. The color filter CF may include at least one among a red pigment, a green pigment, and a blue pigment. The first inter-layer dielectric layer 15 and the second inter-layer dielectric layer 80 may include silicon oxide such as tetra-ethyl-ortho-silicate (TEOS) and High Density Plasma (HDP)-Oxide. The multiple layers of metal lines 70 may include a metal such as tungsten (W) and/or a metal compound such as a titanium nitride (TiN).

The phase difference detectors 60_L and 60_R may include top electrodes 30_L and 30_R, buried photodiodes 40_L and 40_R, and bottom electrodes 50_L and 50_R, respectively. The top electrodes 30_L and 30_R, may include a transparent conductive layer such as indium tin oxide (ITO). Therefore, light that penetrates through the main photodiode PD may pass through the top electrodes 30_L and 30_R and go into the buried photodiodes 40_L and 40_R. The buried photodiodes 40_L and 40_R may include a P-type region that includes P-type ions, an intrinsic region, and an N-type region that includes N-type ions. The buried photodiodes 40_L and 40_R may sense visible lights or infrared rays and generate photocharges. The bottom electrodes 50_L and 50_R may include a metal such as tungsten (W) and/or a metal compound such as a titanium nitride (TiN). The bottom electrodes 50_L and 50_R may reflect visible lights or infrared rays or the electrodes may be optically opaque.

The phase difference detectors 60_L and 60_R may include a left phase difference detector 60_L that includes the left top electrode 30_L, the left buried photodiode and the left bottom electrode 50_L, and a right phase difference detector 60_R that includes the right top electrode 30_R, the right buried photodiode 40_R, and the right bottom electrode 50_R. The left phase difference detector 60_L may be vertically overlapping and aligned with the left side region of the main photodiode PD, and the right phase difference detector 60_R may be vertically overlapping and aligned with the right side region of the main photodiode PD.

The sides of the phase difference detectors 60_L and 60_R may be flat vertically. For example, the sides of the left top electrode 30_L, the left buried photodiode 40_L and the left bottom electrode 50_L may be vertically aligned with each other, and the sides of the right top electrode 30_R, the right buried photodiode 40_R, and the right bottom electrode 50_R may be vertically aligned with each other.

Photocharges generated in the left buried photodiode 40_L may be electrically used by the left top electrode 30_L and the left bottom electrode 50_L. Also, photocharges generated in the right buried photodiode 40_R may be electrically used by the right top electrode 30_R and the right bottom electrode 50_R. For example, an auto-focus function may be realized by analyzing the phase difference between the light entering the left phase difference detector 60_L and the light entering the right phase difference detector 60_R and comparing the photocharges generated in the left buried photos ode 40_L with the photocharges generated in the right buried photodiode 40_R.

Figure 3B:
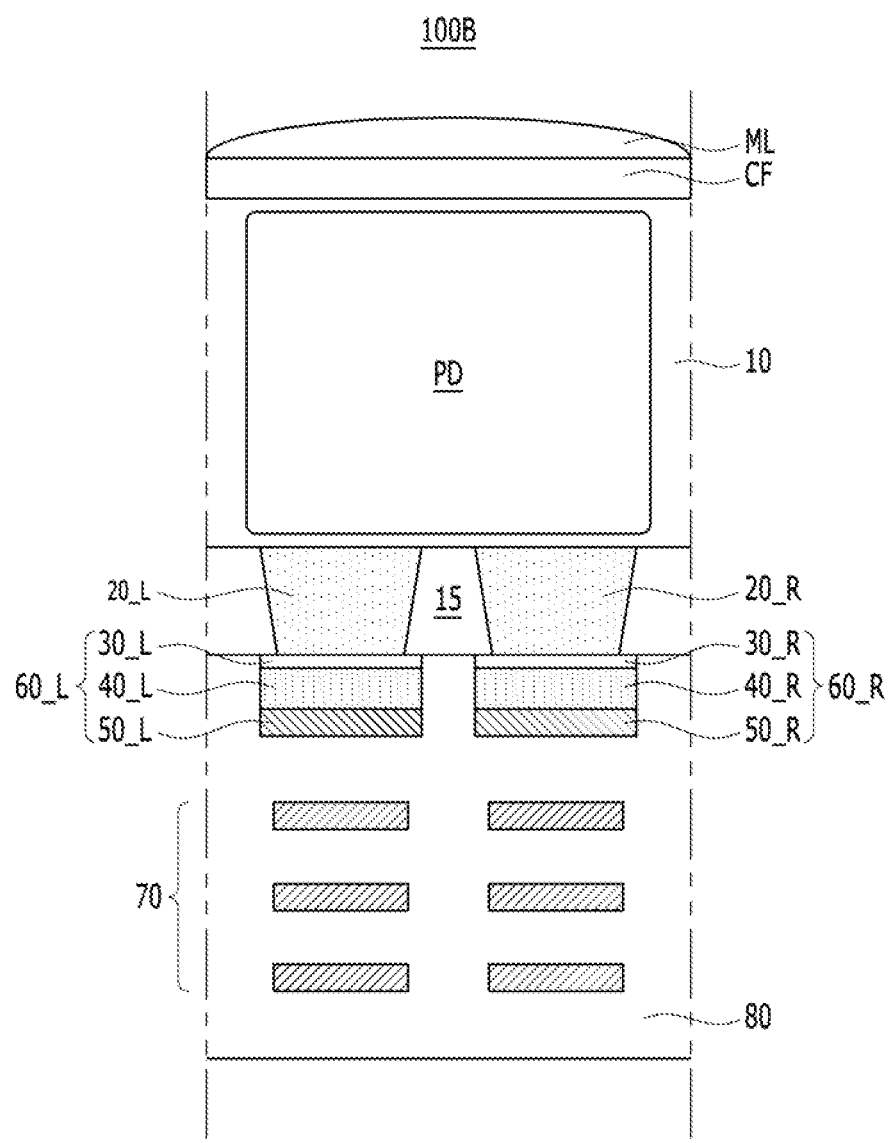

Referring to FIG. 3B, a pixel 100B of an image sensor in accordance with an embodiment of the present invention may further include light guides 20_L and 20_R that are formed between the main photodiode PD and the phase difference detectors 60_L and 60_R so that the light guides 20_L and 20_R are surrounded by the first inter-layer dielectric layer 15. The light guides 20_L and 20_R may include a left light guide 20_L that is vertically aligned with the left phase difference detector 60_L and a right light guide 20_R that is vertically aligned with the right phase difference detector 60_R.

The light guides 20_L and 20_R may include a material that is transparent to visible lights or infrared ray and has a higher refractive index than the first inter-layer dielectric layer 15, such as a titanium oxide ($TiO_2$), a lanthanum oxide ($La_2O_3$), a zirconium oxide (ZrO) or a combination thereof. Therefore, the light that penetrates through the main photodiode PD in the substrate 10 may be totally reflected on the interface between the light guides 20_L and 20_R and the first inter-layer dielectric layer 15 and focused onto the phase difference detectors 60_L and 60_R. The sidewalls of the light guides 20_L and 20_R may be slanted to focus the light toward the phase difference detectors 60_L and 60_R. The light guides 20_L and 20_R may entirely or partially overlap with the phase difference detectors 60_L and 60_R. That is, the light guides 20_L and 20_R may have a layout which overlaps the left and right phase difference detectors 60_L and 60_R, respectively.

Figure 3C:
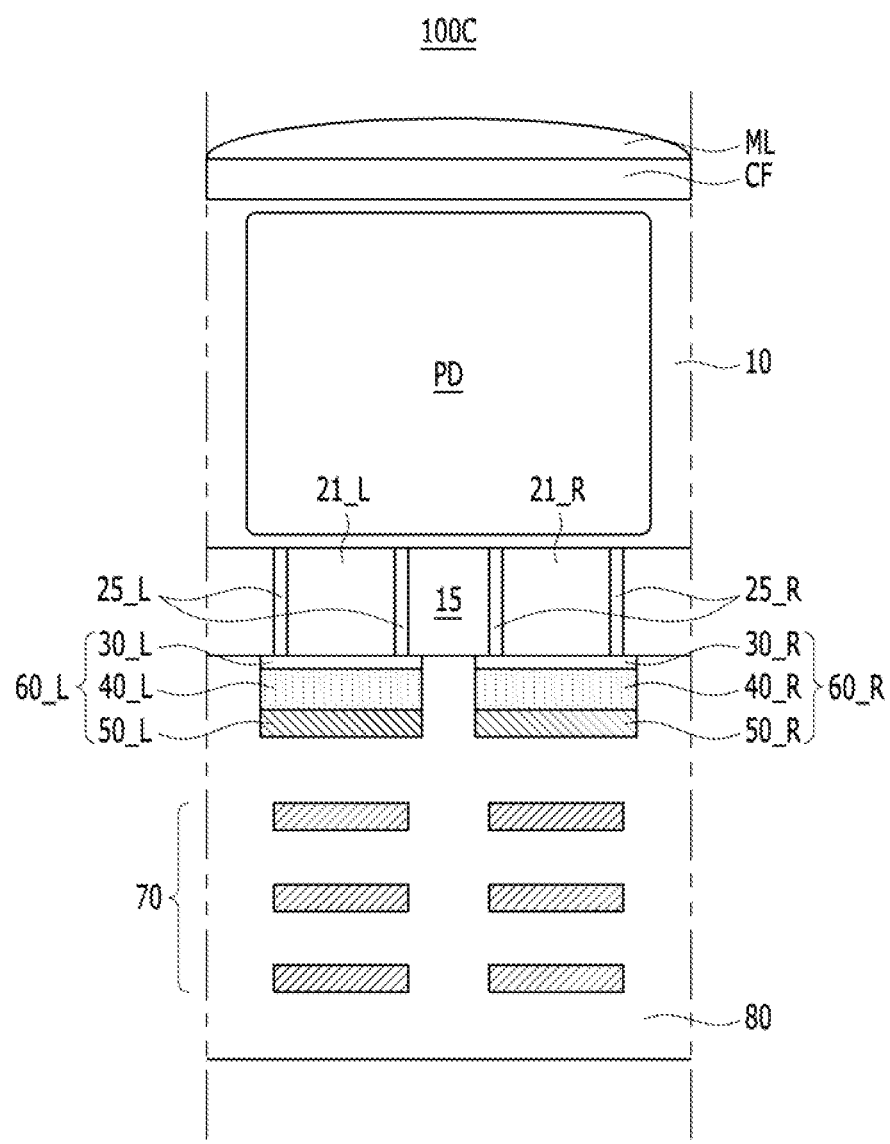

Referring to FIG. 3C, a pixel 100C of an image sensor in accordance with an embodiment of the present invention may further include guide dams 25_L and 25_R. The guide dams 25_L and 25_R may include a left guide dam 25_L that is vertically overlapping and aligned with the left phase difference detector 60_L and a right guide dam 25_R that is vertically overlapping and aligned with the right phase difference detector 60_R.

The guide dams 25_L and 25_R may include an air gap or a material having a lower refractive index than the first inter-layer dielectric layer 15. Therefore, total reflection of light may occur on the interface between the first inter-layer dielectric layer 15 and the guide dams 25_L and 25_R, and the light that goes through light paths inside the guide dams 25_L and 25_R may be focused onto the phase difference detectors 60_L and 60_R. The left and right guide dams 25_L and 25_R may have a rim shape or a frame shape along the perimeters of the phase difference detectors 60_L and 60_R, in a top view.

Figure 3D:
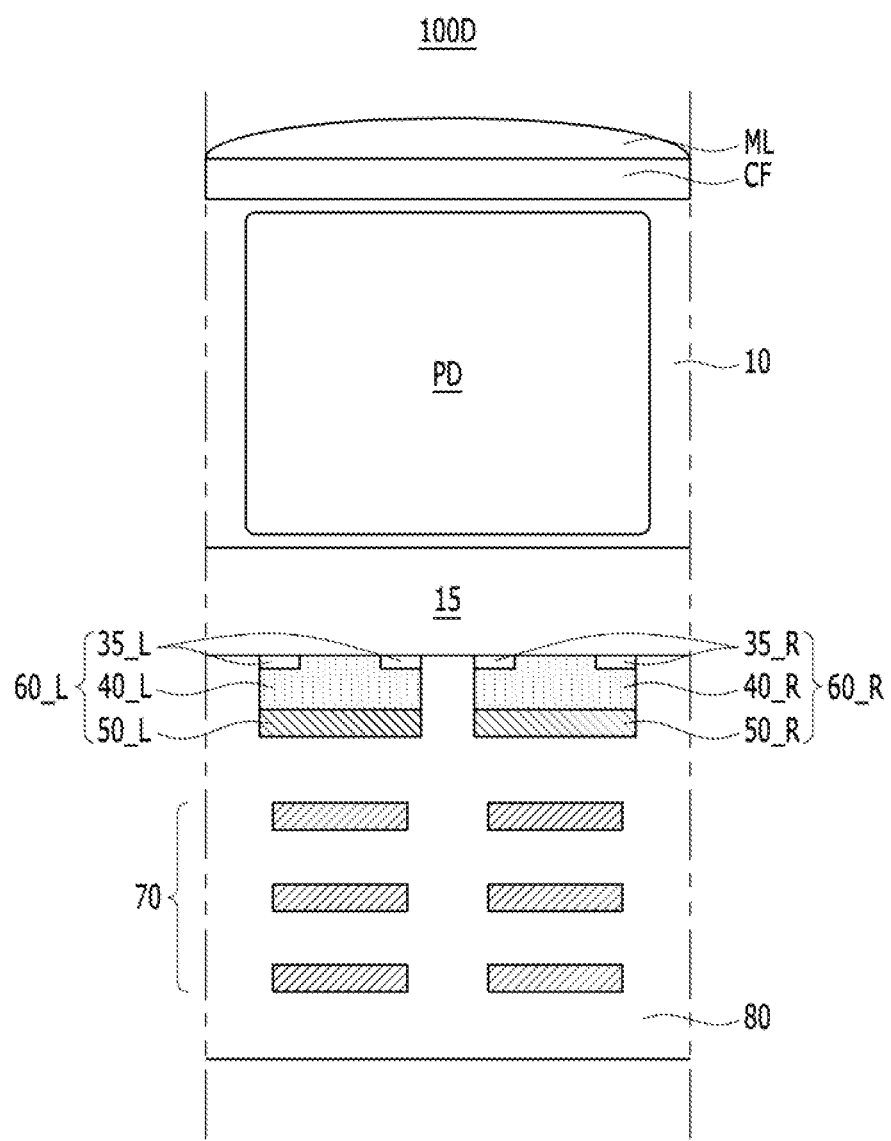

Referring to FIG. 3D, a pixel 100D of an image sensor in accordance with an embodiment of the present invention may include left and right phase difference detectors 60_L and 60_R having rim shaped or frame-shaped left and right top electrodes 35_L and 35_R, respectively, compared with the pixel 100A shown in FIG. 3A. While an electrode material is not formed in the central regions of the left and right top electrodes 35_L and 35_R, the buried photodiodes 40_L and 40_R are formed in the central regions of the left and right top electrodes 35_L and 35_R. Thus, the amount of light reception of the buried photodiodes 40_L and 40_R can be increased. In some embodiment of the present invention, the left and right top electrodes 35_L and 35_R may be pads in bar shapes or in island shapes.

Figure 3E:
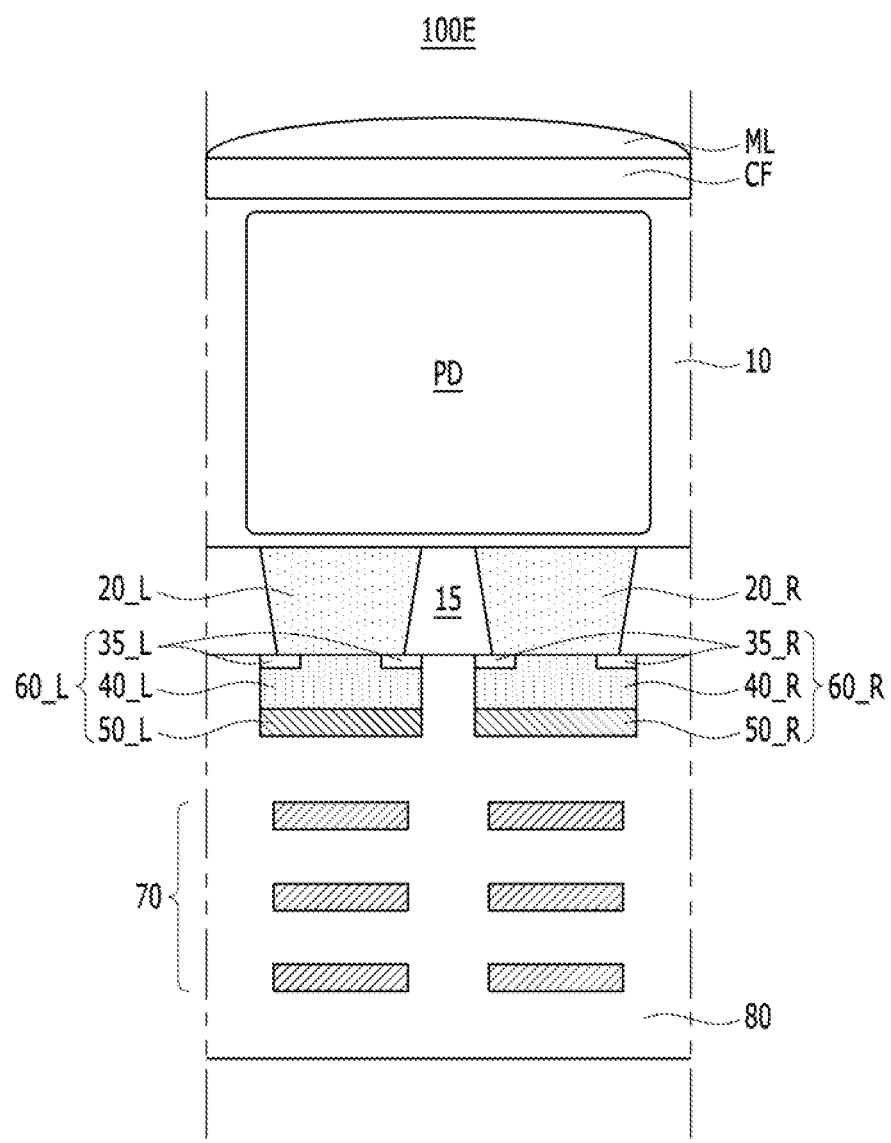

Referring to FIG. 3E, a pixel 100E of an image sensor in accordance with an embodiment of the present invention may include left and right phase difference detectors 60_L and 60_R having the light guides 20_L and 20_R and the rim shaped or frame-shaped left and right top electrodes 35_L and 35_R, compared with the pixels 100A, 100B and 100D described by referring to FIGS. 3A, 3B and 3D. The light guides 20_L and 20_R may be understood by referring to FIG. 3B, and the left and right top electrodes 35_L and 35_R may be understood by referring to FIG. 3D.

Figure 3F:
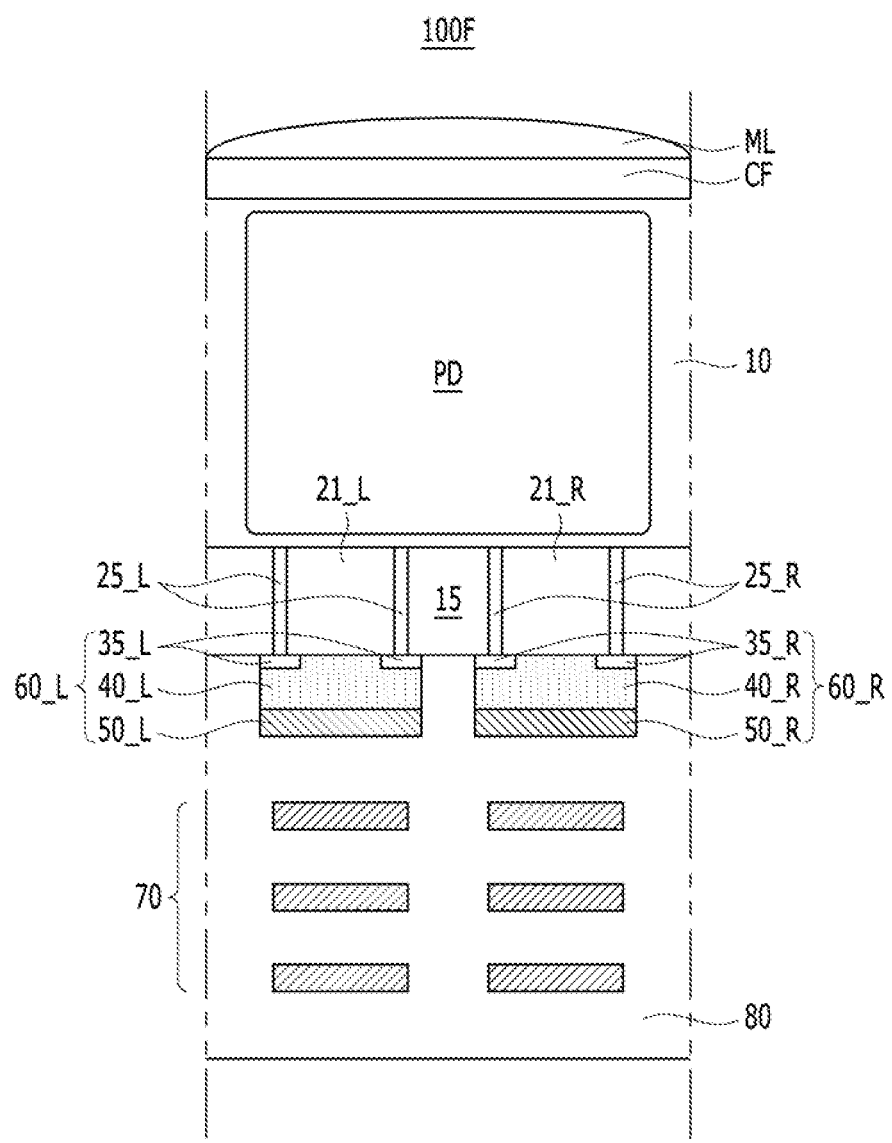

Referring to FIG. 3F, a pixel 100F of an image sensor in accordance with an embodiment of the present invention may include left and right phase difference detectors 60_L and 60_R having the guide dams 25_L and 25_R and the rim shaped or frame-shaped left and right top electrodes 35_L and 35_R, compared with the pixels 100A, 100C and 100D described by referring to FIGS. 3A, 3C and 3D. Each of the guide dams 25_L and 25_R may have a rim shape or a frame shape in a top view.

The main photodiodes PD of the pixels 100A to 100F in accordance with the diverse embodiments of the present invention may sense visible lights, and the buried photodiodes 40_L and 40_R of the phase difference detectors 60_L and 60_R may sense infrared ray. The visible lights may be sufficiently sensed by the main photodiodes PD of the substrates 10, but the infrared ray may penetrate through the main photodiodes PD and the substrates 10 since the infrared ray has very long wavelength. Therefore, according to the technological concept and spirit of the present invention, the buried photodiodes 40_L and 40_R of the phase difference detectors 60_L and 60_R may sense the infrared ray which penetrates through the main photodiodes PD and the substrates 10 and generate photocharges.

Specifically, the buried photodiodes 40_L and 40_R of the phase difference detectors 60_L and 60_R may function as infrared ray sensing photodiodes. Accordingly, the buried photodiodes 40_L and 40_R of the phase difference detectors 60_L and 60_R described in the present patent specification may be understood as infrared ray sensing photodiodes, which includes a left infrared ray sensing photodiode and a right infrared ray sensing photodiode 40_R.

FIG. 4 is a layout of a pair of pixels 200 of an image sensor in accordance with an embodiment of the present invention. FIGS. 5A to 5F are horizontal cross-sectional views taken along the line II-II' of FIG. 4 to describe various pixel pairs of image sensors in accordance with embodiments of the present invention.

Referring to FIG. 4, the pixel pair 200 of the image sensor in accordance with the embodiment of the present invention may include a main photodiode pair PD_L and PD_R, a phase difference detector pair 60_L and 60_R, and a color filter pair CF_L and CF_R. The main photodiode pair PD_L and PD_R may include a left main photodiode PD_L and a right main photodiode PD_R, and the phase difference detector pair 60_L and 60_R may include a left phase difference detector 60_L and a right phase difference detector 60_R. The color filter pair CF_L and CF_R may include a left color filter CF_L and a right color filter CF_R.

The left main photodiode PD_L, the left phase difference detector 60_L and the left color filter CF_L may overlap with each other, while the right main photodiode PD_R, the right phase difference detector 60_R and the right color filter CF_R may overlap with each other. The left phase difference detector 60_L may have a size substantially a half the area occupied by the left main photodiode PD_L, and the right phase difference detector 60_R may have a size substantially a half the area occupied by the right main photodiode PD_R.

The left phase difference detector 60_L may be disposed to the left side of the left main photodiode PD_L and/or the left color filter CF_L, while the right phase difference detector 60_R may be disposed to the right side of the right main photodiode PD_R and/or the right color filter CF_R. That is, the left phase difference detector 60_L and the right phase difference detector 60_R may be disposed symmetrical to each other and have mirror images to each other. According to another embodiment of the present invention, the left phase difference detector 60_L and the right phase difference detector 60_R may be disposed to be vertically aligned. For example, the left phase difference detector 60_L and the right phase difference detector 60_R may be understood as a top phase difference detector and a bottom phase difference detector, respectively.

Since the pixel pair 200 in accordance with the embodiment of the present invention has the phase difference detectors 60_L and 60_R that are located at the left and right sides, respectively, the pixel pair may be used for detecting a phase difference. Specifically, the left phase difference detector 60_L may analyze the intensity of light penetrating through the left main photodiode PD_L, and the right phase difference detector 60_R may analyze the intensity of light penetrating through the right main photodiode PD_R. Therefore the image sensor in accordance with the embodiment of the present invention may detect the phase difference of light and realize the auto-focus function by using one pixel pair 200.

Figure 5A:
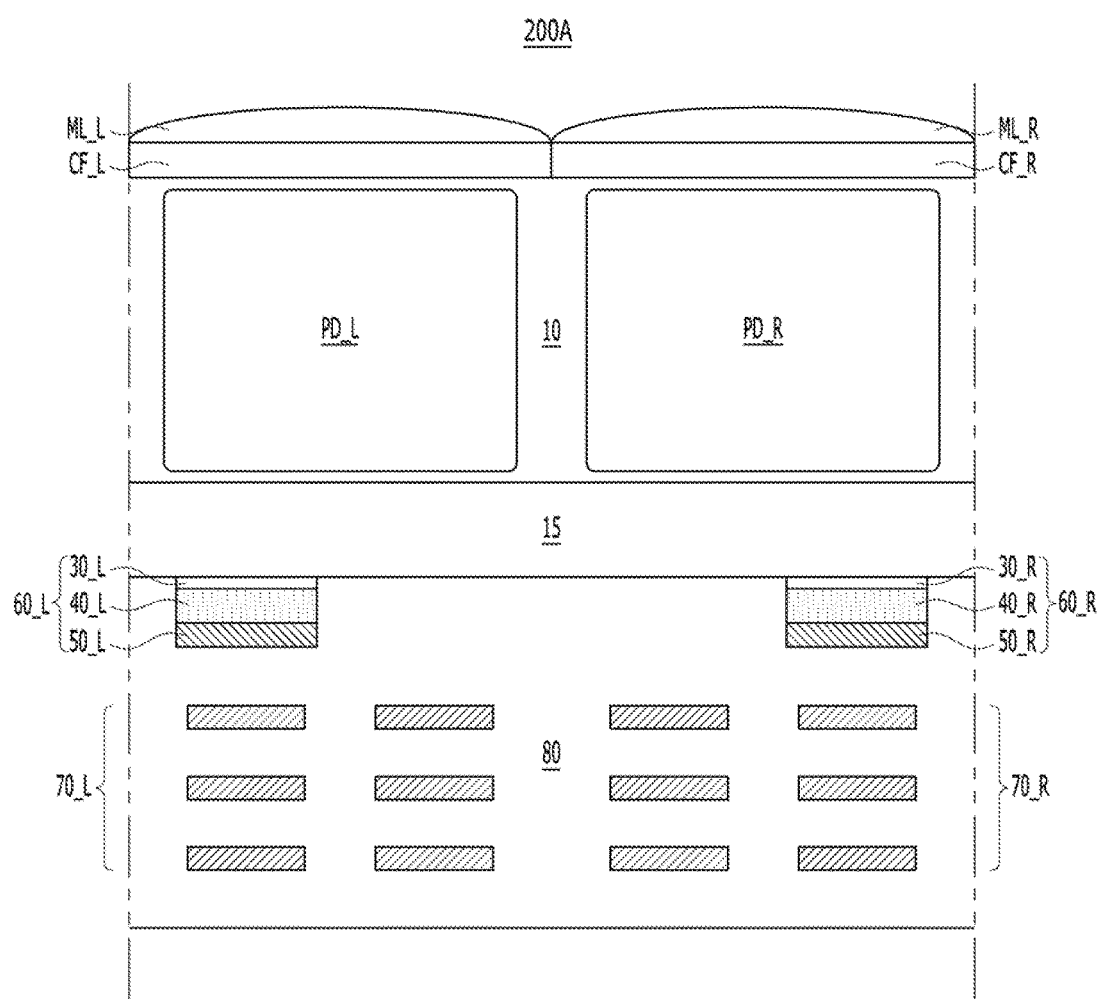
FIGS. 5A to 5F are horizontal cross-sectional views taken along the line II-II' of FIG. 4 to describe various pixel pairs of image sensors in accordance with embodiments of the present invention.

FIGS. 5A to 5F are horizontal cross-sectional views of diverse pixel pairs 200A to 200F of image sensors in accordance with diverse embodiments of the present invention. Referring to FIG. 5A, a pixel pair 200A of an image sensor in accordance with an embodiment of the present invention may include left and right main photodiodes PD_L and PD_R that are formed in a substrate 10, left and right color filters CF_L and CF_R that are stacked over an upper surface of the substrate 10, left and right micro lenses ML_L and ML_R, a first inter-layer dielectric layer 15 disposed below a lower surface of the substrate 10, left and right phase difference detectors 60_L and 60_R, left and right metal lines 70_L and 70_R, and a second inter-layer dielectric layer 80.

The left phase difference detector 60_L may include a left top electrode 30_L, a left buried photodiode 40_L, and a left bottom electrode 50_L that overlap with a left side region of the left main photodiode PD_L. The right phase difference detector 60_R may include a right top electrode 30_R a right buried photodiode 40_R and a right bottom electrode 50_R that overlap with a right side region of the right main photodiode PD_R. The left phase difference detector 60_L and the right phase difference detector 60_R may be arranged symmetrical to each other and the detectors are mirror images of each other.

The left phase difference detector 60_L and the right phase difference detector 60_R may be disposed far from each other so that the detectors may detect a phase difference of incident light quickly and accurately. That is, the left phase difference detector 60_L may be disposed to be one-sided toward the left side region of the left main photodiode PD_L so that the left phase difference detector 60_L may advantageously sense the phase of the incident light that passes through the left main photodiode PD_L from the right top part and enters at a slanted angle. Furthermore, the right phase difference detector 60_R may be disposed to be one-sided toward the right side region of the right main photodiode PD_R so that the right phase difference detector 60_R may advantageously sense the phase of the incident light that passes through the right main photodiode PD_R from the left top part and enters at a slanted angle. Other constituent elements that are not described herein may be understood by referring to FIG. 3A.

Figure 5B:
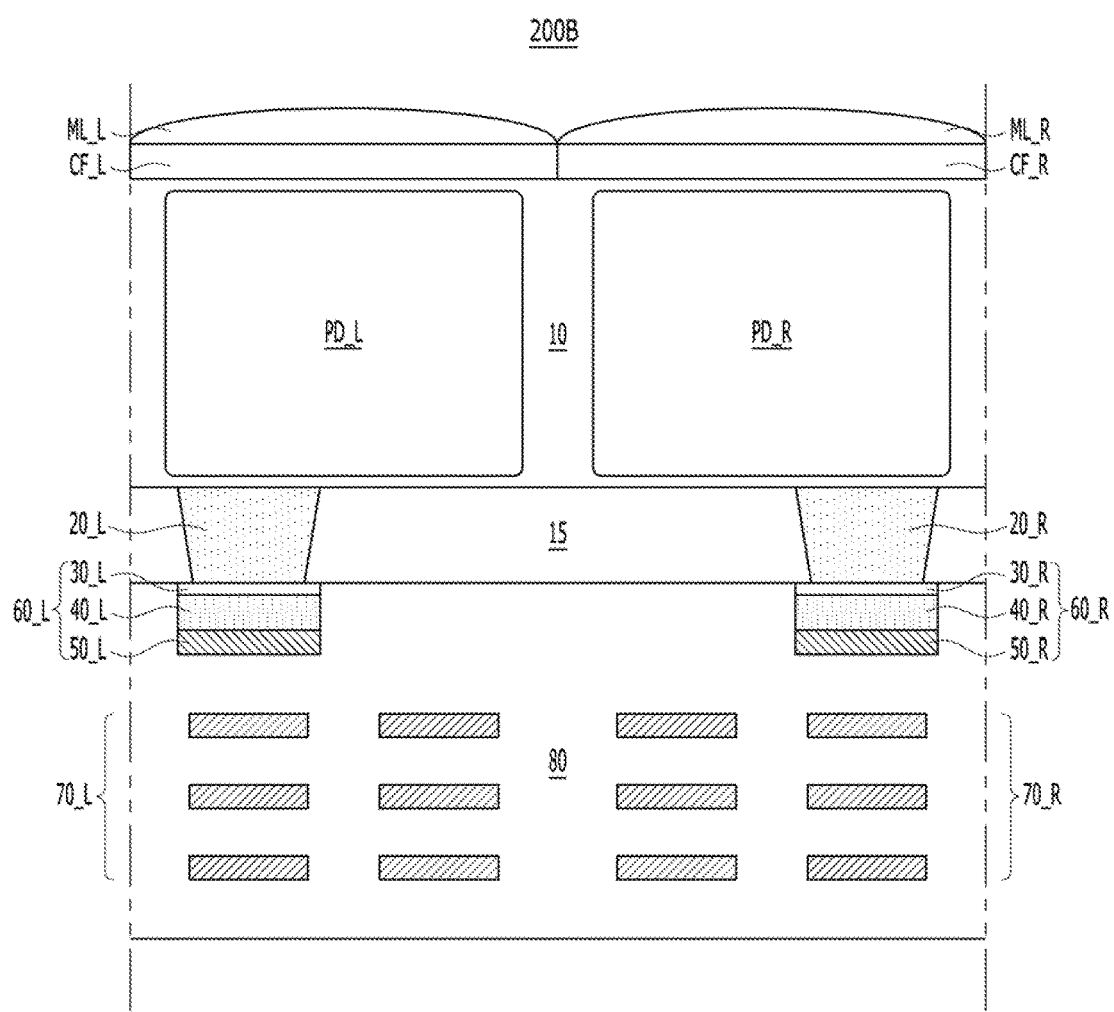

Referring to FIG. 5B, a pixel pair 200B of an image sensor in accordance with an embodiment of the present invention may further include left and right light guides 20_L and 20_R that are formed between the left and right main photodiodes PD_L and PD_R and the left and right phase difference detectors 60_L and 60_R in addition to the constituent elements of the pixel pair 200A shown in FIG. 5A. The left and right light guides 20_L and 20_R are surrounded by the first inter-layer dielectric layer 15. The left and right light guides 20_L and 20_R may include a left light guide 20_L that is vertically aligned with the left side region of the left main photodiode PD_L and the left phase difference detector 60_L, and a right light guide 20_R that is vertically aligned with the right side region of the right main photodiode PD_R and the right phase difference detector 60_R. The pixel pair 200B of the image sensor in accordance with the embodiment of the present invention may be understood in detail by referring to FIGS. 3B and 5A.

Figure 5C:
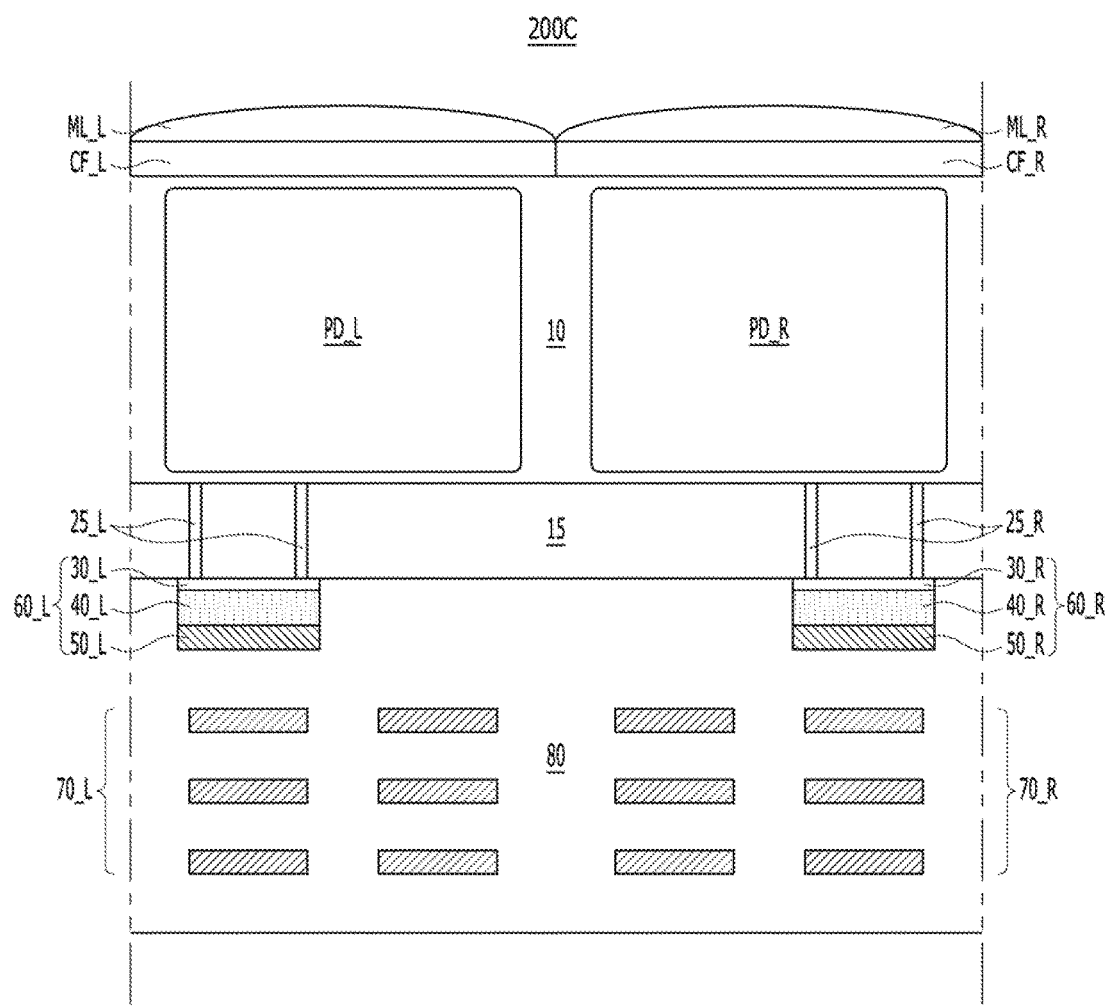

Referring to FIG. 5C, a pixel pair 200C of an image sensor in accordance with an embodiment of the present invention may further include left and right guide dams 25_L and 25_R in addition to the constituent elements of the pixel pair 200A shown in FIG. 5A. The left and right guide dams 25_L and 25_R may include a left guide dam 25_L that is vertically overlapping and aligned with the left side region of the left main photodiode PD_L and the left phase difference detector 60_L and a right guide dam 25_R that is vertically overlapping and aligned with the right side region of the right main photodiode PD_R and the right phase difference detector 60_R. The left and right guide dams 25_L and 25_R may include an air gap or a material having a lower refractive index than the first inter-layer dielectric layer 15. Each of the left and right guide dams 25_L and 25_R may have a rim shape or a frame shape when viewed from the top.

Figure 5D:
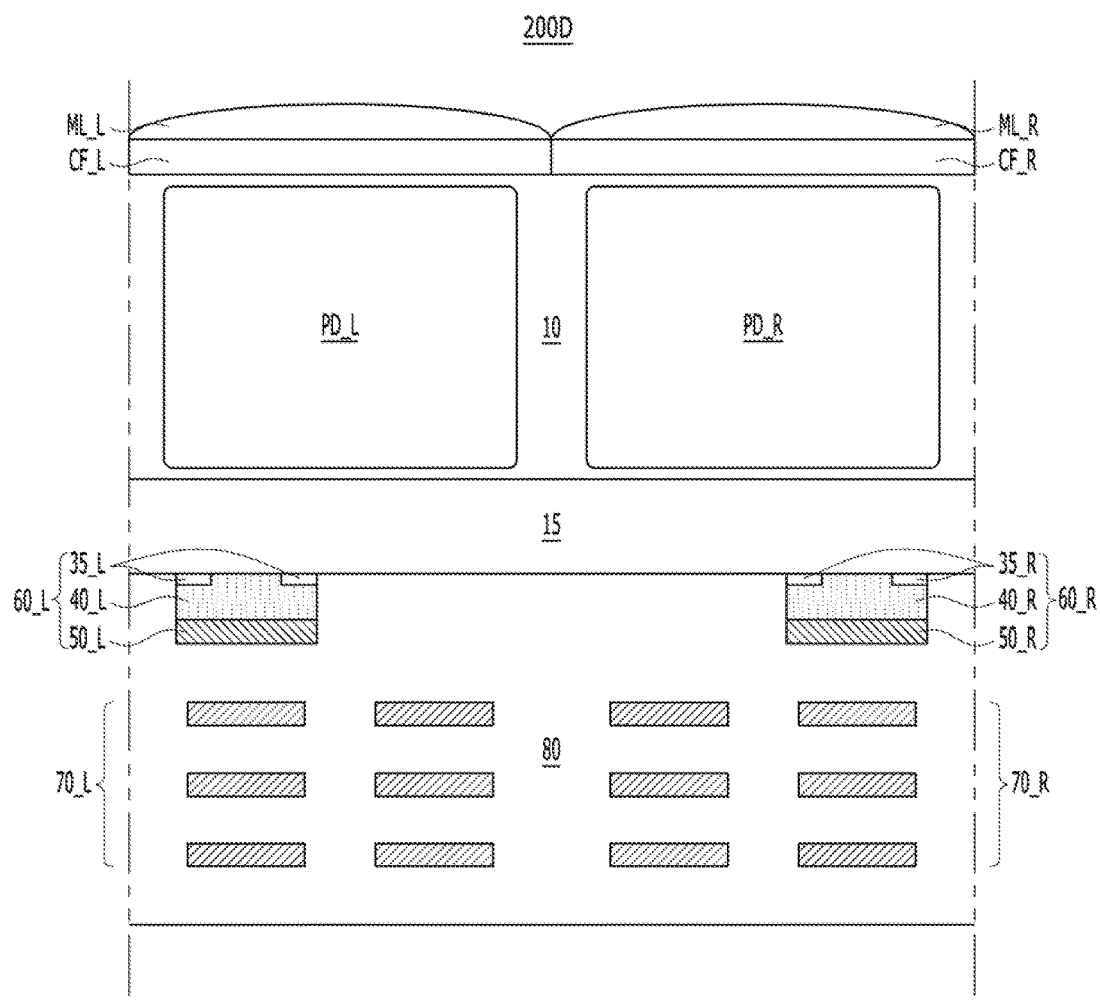

Referring to FIG. 5D, a pixel pair 200D of an image sensor in accordance with an embodiment of the present invention may include a left phase difference detector 60_L that vertically overlaps the left side region of the left main photodiode PD_L and a right phase difference detector 60_R that vertically overlaps the right side region of the right main photodiode PD_R. The left phase difference detector 60_L may include a left top electrode 35_L having a rim shape or a frame shape, and the right phase difference detector 60_R may include a right top electrode 35_R having a rim shape or a frame shape when viewed from the top, compared with the pixel pair 200A shown in FIG. 5A.

Figure 5E:
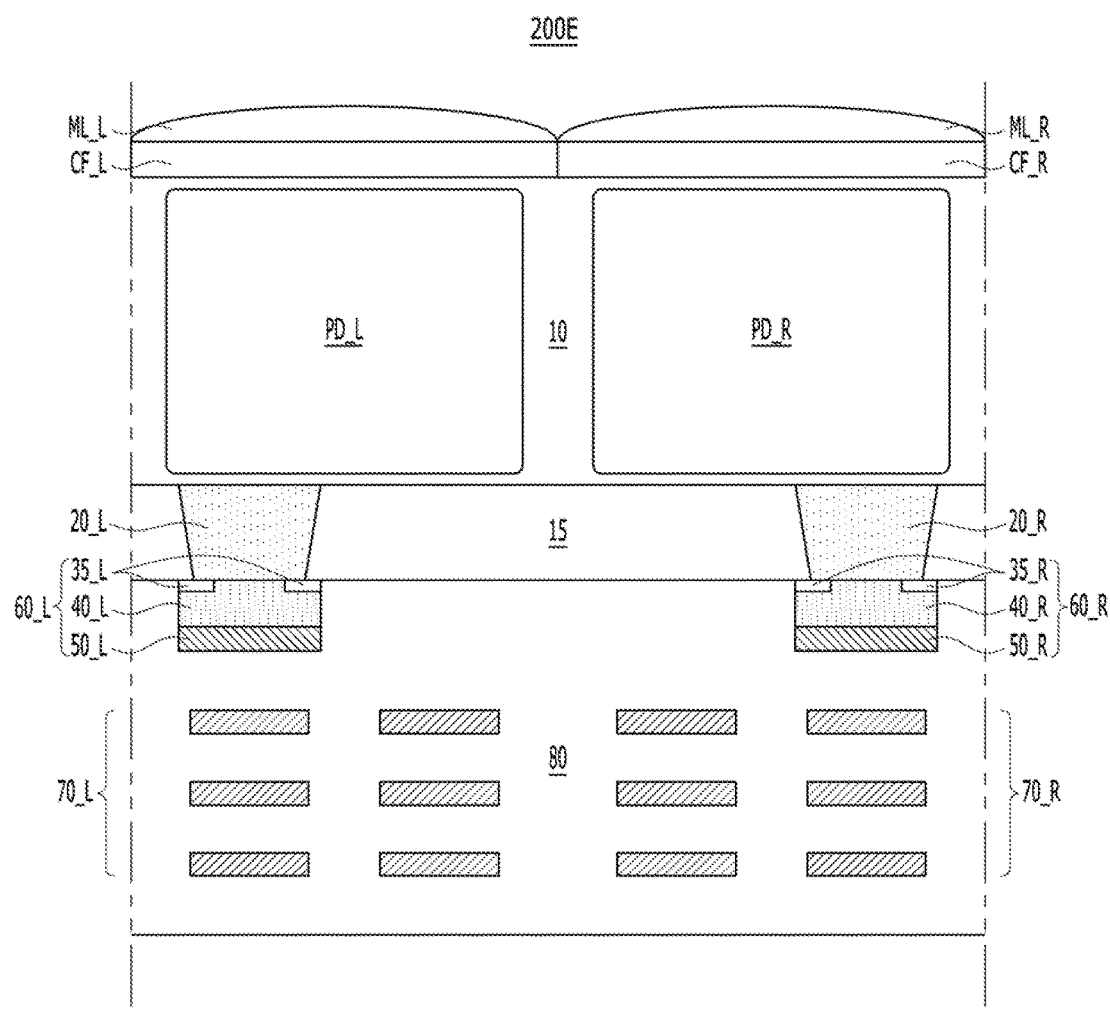

Referring to FIG. 5E, a pixel pair 200E of an image sensor in accordance with an embodiment of the present invention may include left and right phase difference detectors 60_L and 60_R having the left and right light guides 20_L and 20_R and the rim shaped or frame-shaped left and right top electrodes 35_L and 35_R, compared with the pixel pairs 200A, 200B and 200D described with reference to FIGS. 5A, 5B and 5D. As described above, the left and right light guides 20_L and 20_R may include the left light guide 20_L and the right light guide 20_R. The left light guide 20_L is vertically overlapping and aligned with the left side region of the left main photodiode PD_L and the left phase difference detector 60_L. The right light guide 20_R is vertically overlapping and aligned with the right side region of the right main photodiode PD_R and the right phase difference detector 60_R.

Figure 5F:
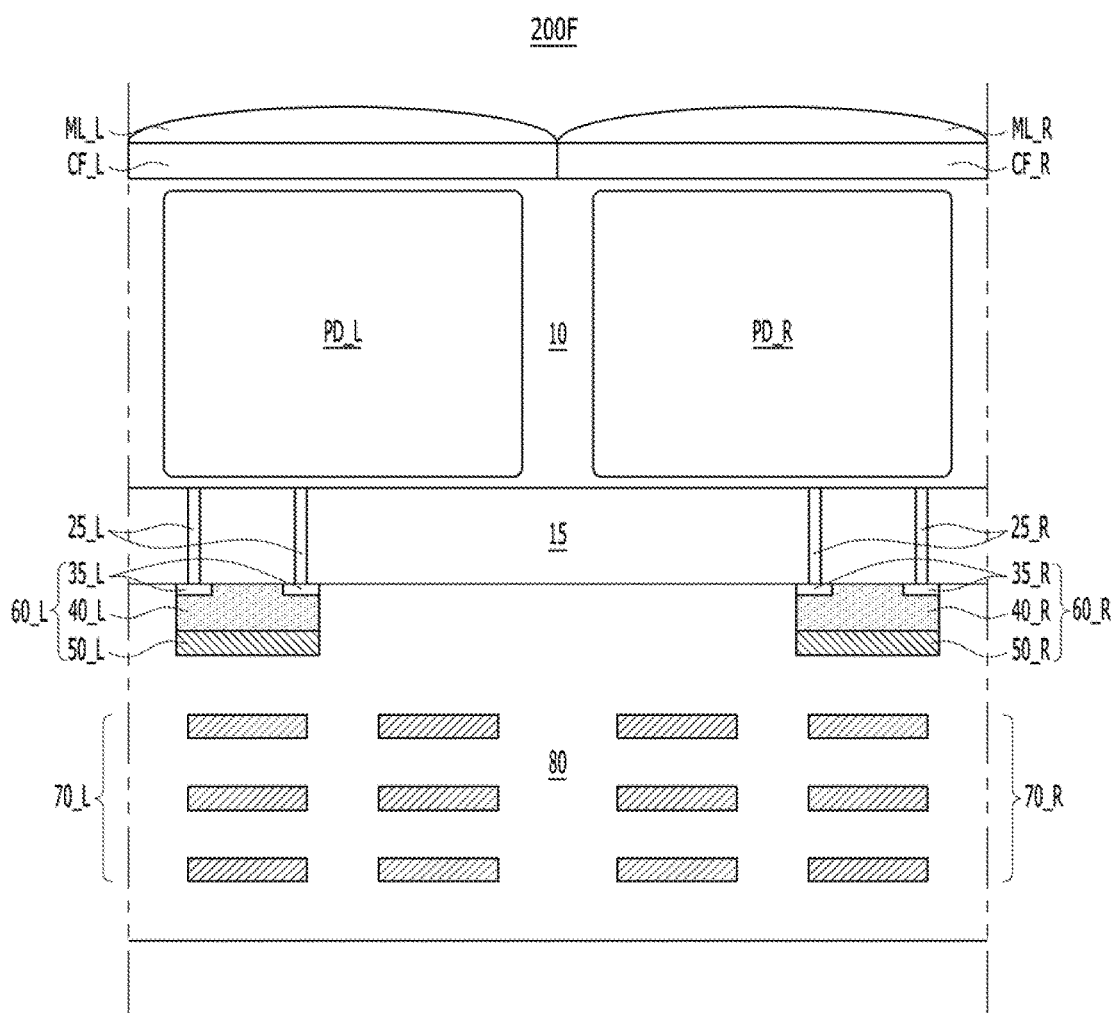

Referring to FIG. 5F, a pixel pair 200F of an image sensor in accordance with an embodiment of the present invention may include left and right phase difference detectors 60_L and 60_R having the left and right guide dams 25_L and 25_R and the rim shaped or frame-shaped left and right top electrodes 35_L and 35_R, compared with the pixel pairs 200A, 200C and 200D described by referring to FIGS. 5A, 5C and 5D. As described above, the guide dams 25_L and 25_R may include the left guide dam 25_L and the right guide dam 25_R. The left guide dam 25_L is vertically overlapping and aligned with the left side region of the left main photodiode PD_L and the left phase difference detector 60_L. The right guide dam 25_R is vertically overlapping and aligned with the right side region of the right main photodiode PD_R and the right phase difference detector 60_R.

As described above, the main photodiodes PD_L and PD_R of the pixel pairs 200A to 200F in accordance with the diverse embodiments of the present invention may sense visible lights, and the buried photodiodes 40_L and 40_R of the phase difference detectors 60_L and 60_R may sense infrared ray. Specifically, the buried photodiodes 40_L and 40_R of the phase difference detectors 60_L and 60_R may function as infrared ray sensing photodiodes. For example, the left buried photodiode 40_L may be understood as a left infrared ray sensing photodiode, and the right buried photodiode 40_R may be understood as a right infrared ray sensing photodiode.

FIGS. 6A to 6D are horizontal cross-sectional views of the phase difference detectors shown in 60A to 60D, respectively, in accordance with diverse embodiments of the present invention.

Figure 6A:
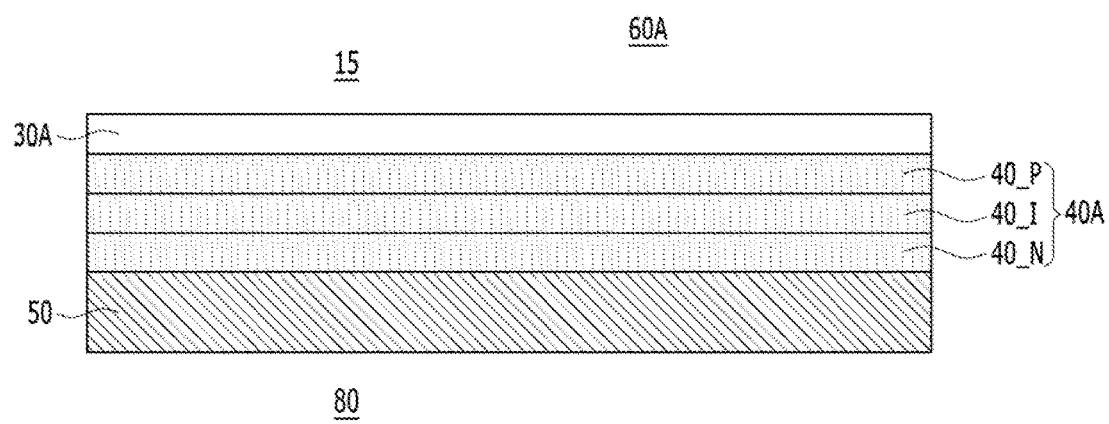
FIGS. 6A to 6D are horizontal cross-sectional views of phase difference detectors in accordance with embodiments of the present invention.

Referring to FIG. 6A, a phase difference detector 60A in accordance with an embodiment of the present invention may include a bottom electrode 50, a PIN photodiode 40A, and a top electrode 30A. The bottom electrode 50 may include a metal such as tungsten (W) or a metal compound such as a titanium nitride (TiN). The top electrode 30A may include a transparent conductor such as an indium tin oxide (ITO). According to another embodiment of the present invention, the top electrode 30A may include a conductor having a rim shape or a frame shape in a top view. The rim shaped or frame-shaped top electrode 30A may be opaque with respect to visible lights or infrared ray. The PIN photodiode 40A may include a P-type semiconductor region 40_P containing a P-type impurity, an intrinsic semiconductor region 40_I, and an N-type semiconductor region 40_N containing an N-type impurity. Since the phase difference detector 60A in accordance with the embodiment of the present invention includes the PIN diode, it may have superior light sensing characteristics than a phase, difference detector using a typical PN junction diode.

Figure 6B:
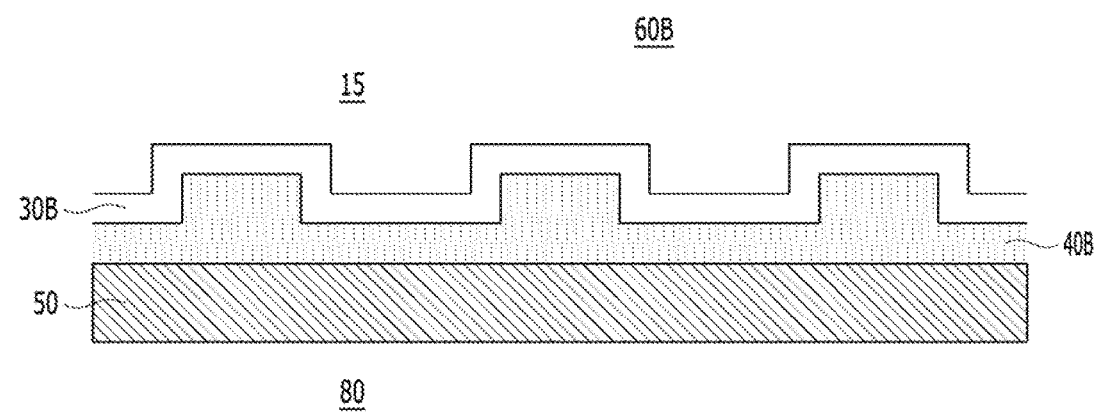

Referring to FIG. 6B, a phase difference detector 60B in accordance with an embodiment of the present invention may include a bottom electrode 50 having a planar surface, a buried photodiode 40B having a curved surface, and a top electrode 30B also having a curved surface. For example, each of the surfaces of the buried photodiode 40B and the top electrode 30B may have a convex-concave shape. Referring back to FIG. 6A, the buried photodiode 40B may include a PIN diode.

Figure 6C:
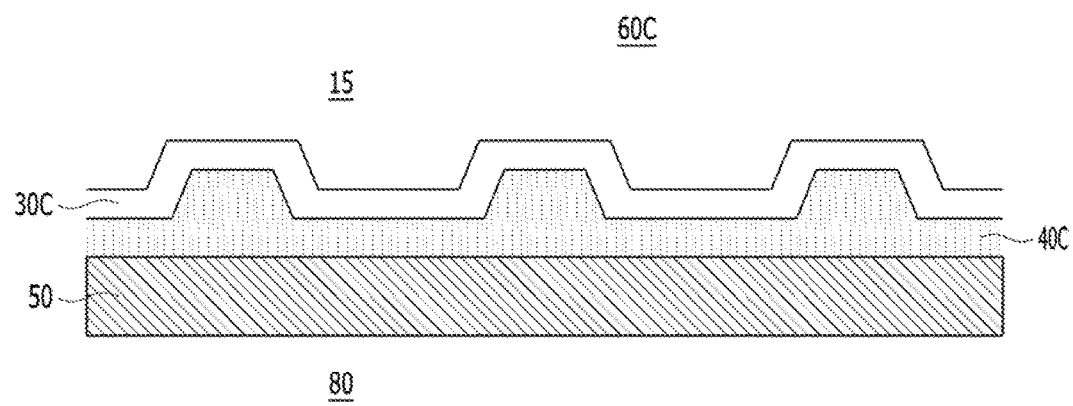

Referring to FIG. 6C, a phase difference detector 60C in accordance with an embodiment of the present invention may include a bottom electrode 50 having a planar surface, a buried photodiode 40C having a curved surface, and a top electrode 30C also having a curved surface. For example, the skies of the buried photodiode 40C and the top electrode 30C may be slanted. Referring back to FIG. 6A, the buried photodiode 40C may include a PIN diode.

Figure 6D:
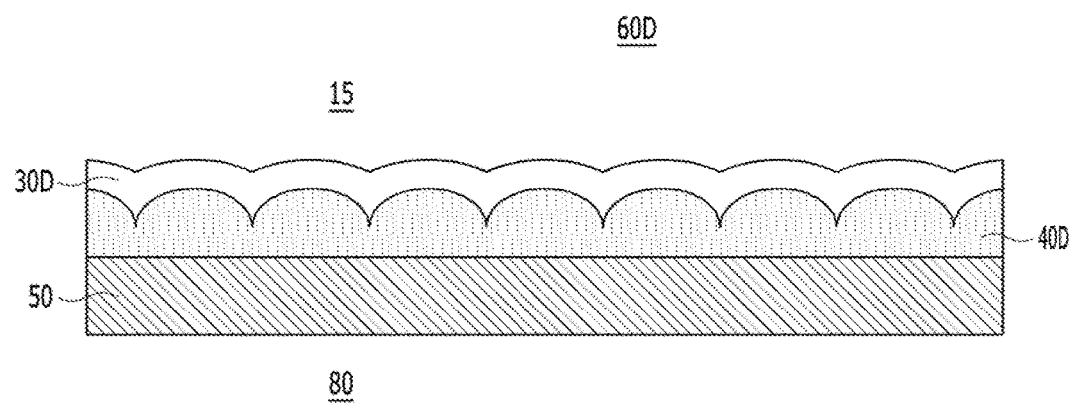

Referring to FIG. 6D, a phase difference detector 60D in accordance with an embodiment of the present invention may include a bottom electrode 50 having a planar surface, a buried photodiode 40D having a round surface, and a top electrode 30D also having a round surface. Referring back to FIG. 6A, the buried photodiode 40D may include a PIN diode.

The curved surfaces of the buried photodiodes 40B to 40D of the phase difference detectors 60B to 60D described with reference to FIGS. 6B to 6D may function as convex lenses. Therefore, the buried photodiodes 40B to 40D may be advantageous in concentrating lights.

Figure 7A:
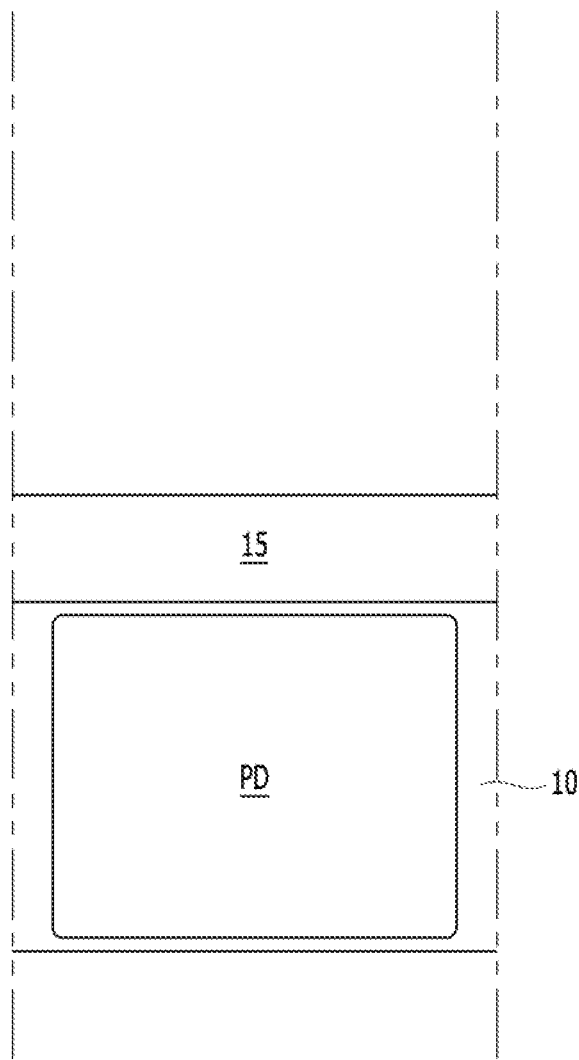
FIGS. 7A to 12B are horizontal cross-sectional views describing a method for forming pixels of diverse image sensors in accordance with embodiments of the present invention.

FIGS. 7A to 12B are horizontal cross-sectional views describing a method for forming pixels of diverse image sensors in accordance with diverse embodiments of the present invention. Referring to FIG. 7A, a method for forming pixels of an image sensor in accordance with an embodiment of the present invention may include: forming a main photodiode PD in a substrate 10 by implanting P-type or N-type impurity ions into the substrate 10, forming a floating diffusion region and pixel transistors (not shown), and performing a deposition process to form a first inter-layer dielectric layer 15 over a first surface of the substrate 10. The substrate 10 may include a single-crystalline silicon wafer or an epitaxially grown single-crystalline silicon layer. The first inter-layer dielectric layer 15 may include a silicon oxide.

Figure 7B:
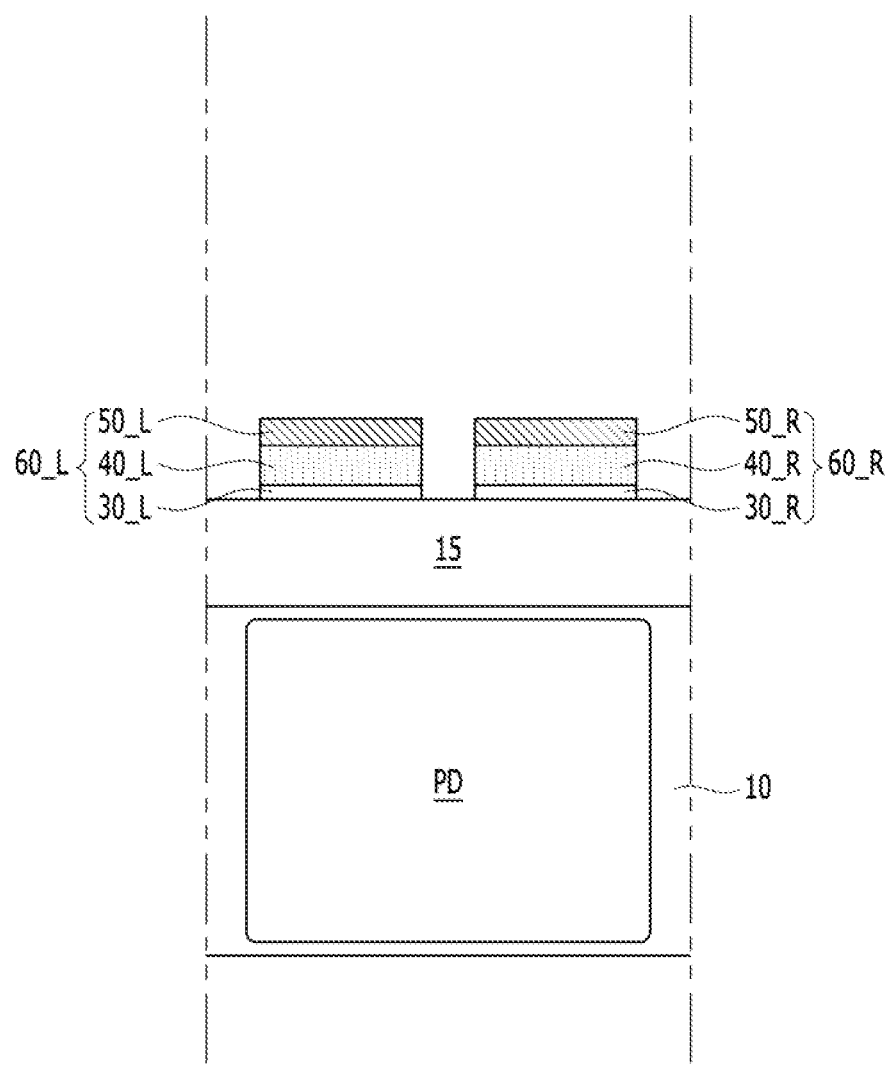

Referring to FIG. 7B, the method for forming pixels of the image sensor in accordance with the embodiment of the present invention may include: forming phase difference detectors 60_L and 60_R over the first inter-layer dielectric layer 15. The phase difference detectors 60_L and 60_R may include a left phase difference detector 60_L that is vertically overlapping and aligned with a left side region of the main photodiode PD, and a right phase difference detector 60_R that is vertically overlapping and aligned with a right side region of the main photodiode PD. The process of forming the phase difference detectors 60_L and 60_R may include forming a top electrode layer, a buried photodiode layer, and a bottom electrode layer over the first inter-layer dielectric layer 15 by performing a deposition process, and forming the left phase difference detector 60_L that includes a left top electrode 30D_L, a left buried photodiode 40D_L, and a left bottom electrode 50_L and a right phase difference detector 60_R that includes a right top electrode 30D_R, a right buried photodiode 40D_R, and a right bottom electrode 50_R by performing photolithography and etch processes.

Figure 7C:
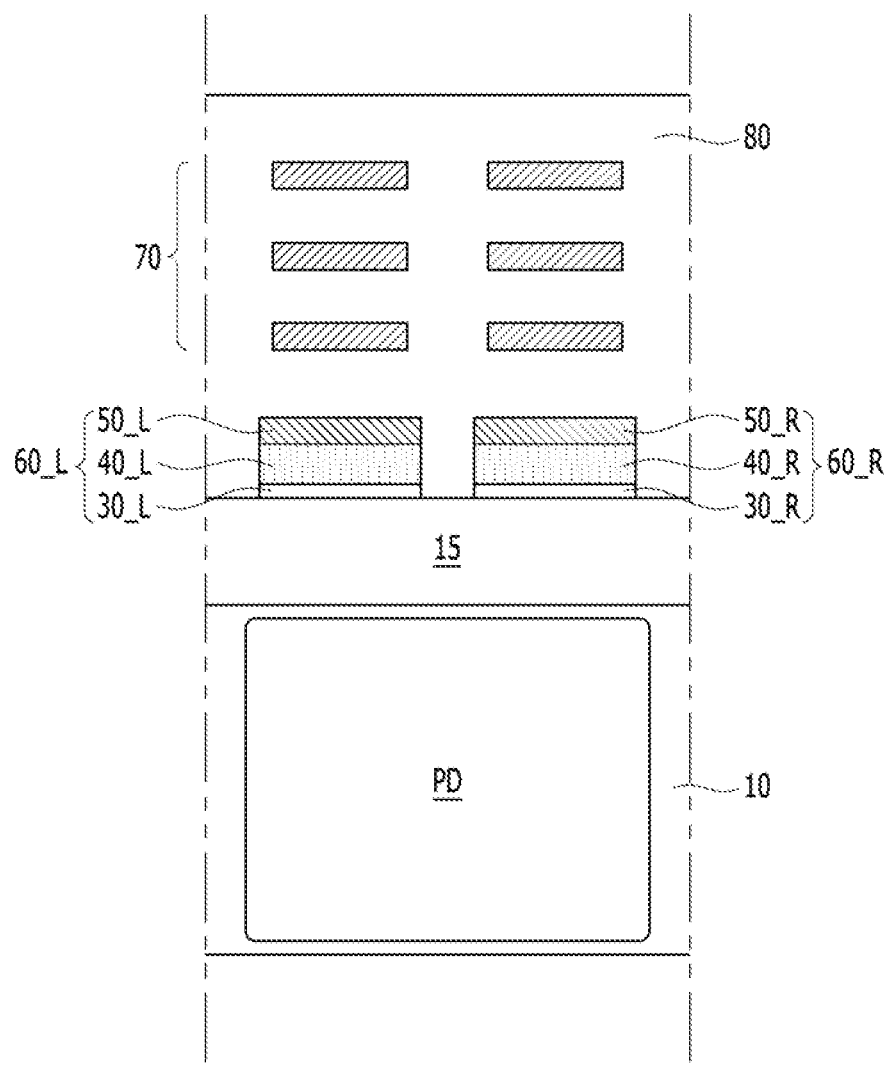

Referring to FIG. 7C, the method for forming pixels of the image sensor in accordance with the embodiment of the present invention may include: forming multiple layers of metal lines 70 and a second inter-layer dielectric layer 80 over the phase difference detectors 60_L and 60_R. The multiple layers of the metal lines 70 may include a metal such as tungsten (W) and a metal compound such as a titanium nitride (TiN). The second inter-layer dielectric layer 80 may include silicon oxide, silicon nitride, silicon oxynitride, and a combination thereof. Subsequently, the method for forming pixels of diverse image sensor in accordance with diverse embodiments of the present invention may include: turning the substrate 10 upside down and forming a color filter CF and a micro lens ML over a second surface of the substrate 10 by referring to FIG. 3A.

Figure 8A:
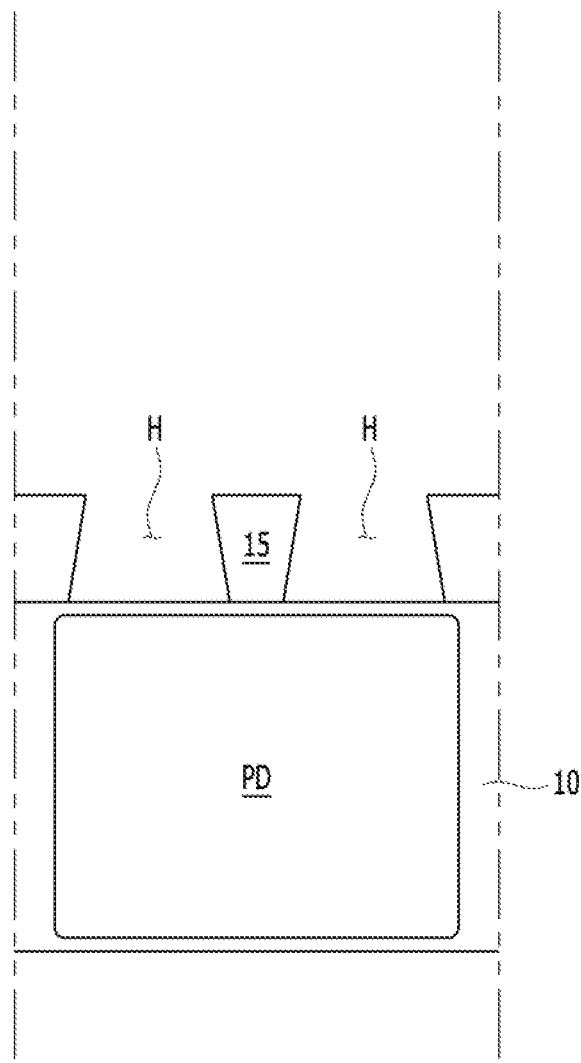

Referring to FIG. 8A, a method for forming pixels of an image sensor in accordance with an embodiment of the present invention may include: performing an ion implantation process to form a main photodiode PD in a substrate 10, performing a deposition process to form a first inter-layer dielectric layer 15 over a first surface of the substrate 10, and performing photolithography and etch processes to form holes H in the first inter-layer dielectric layer 15. Side walls of the holes H may have a negative slope.

Figure 8B:
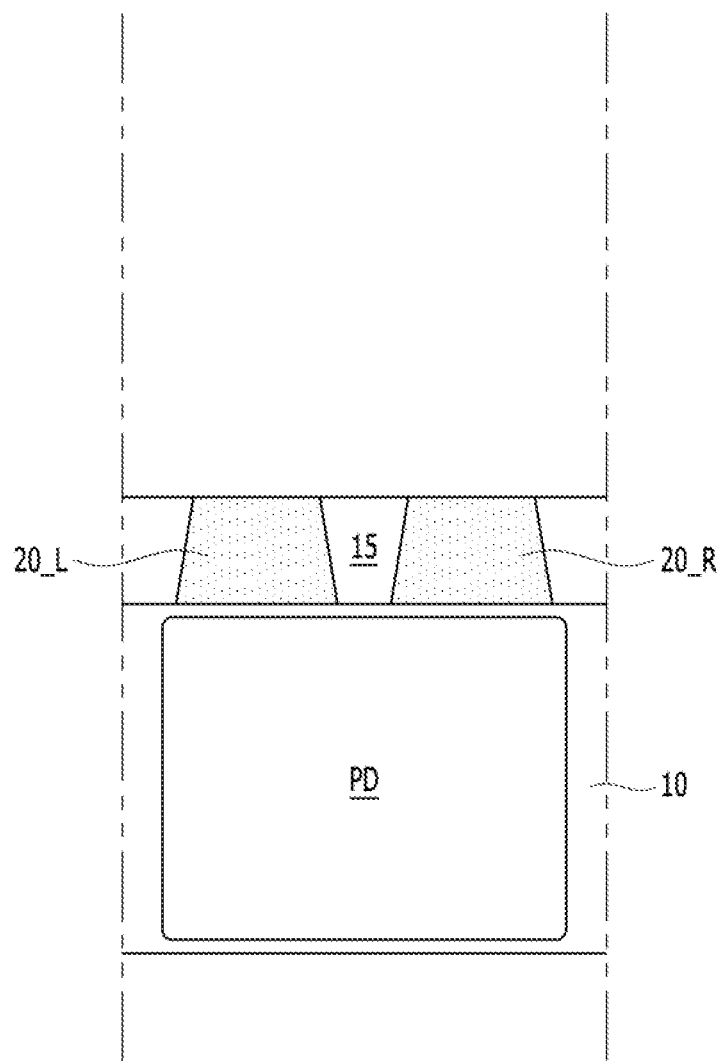

Referring to FIG. 8B, the method for forming pixels of the image sensor in accordance with the embodiment of the present invention may include: filling the holes H with a transparent insulation material having a high refractive index and performing a planarization process such as Chemical Mechanical Polishing (CMP) to form light guides 20_L and 20_R.

Figure 8C:
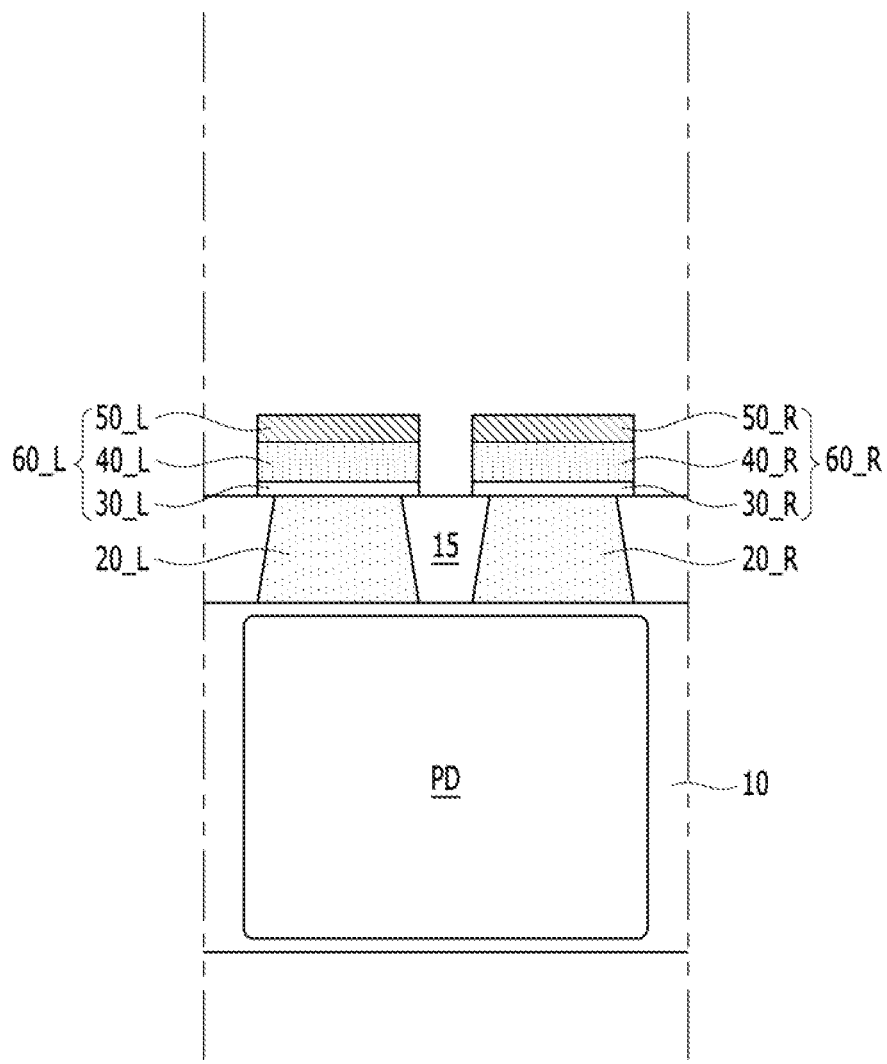

Referring to FIG. 8C, the method for forming pixels of the image sensor in accordance with the embodiment of the present invention may include: forming phase difference detectors 60_L and 60_R that are vertically overlapping and aligned with the light guides 20_L and 20_R, respectively.

Subsequently, the method for forming pixels of the image sensor in accordance with the embodiment of the present invention may include: forming the metal lines 70 and a second inter-layer dielectric layer 80 as shown in FIG. 7C, turning the substrate 10 upside down, and forming a color filter CF and a micro lens ML over a second surface of the substrate 10 as shown in FIG. 3B.

Figure 8D:
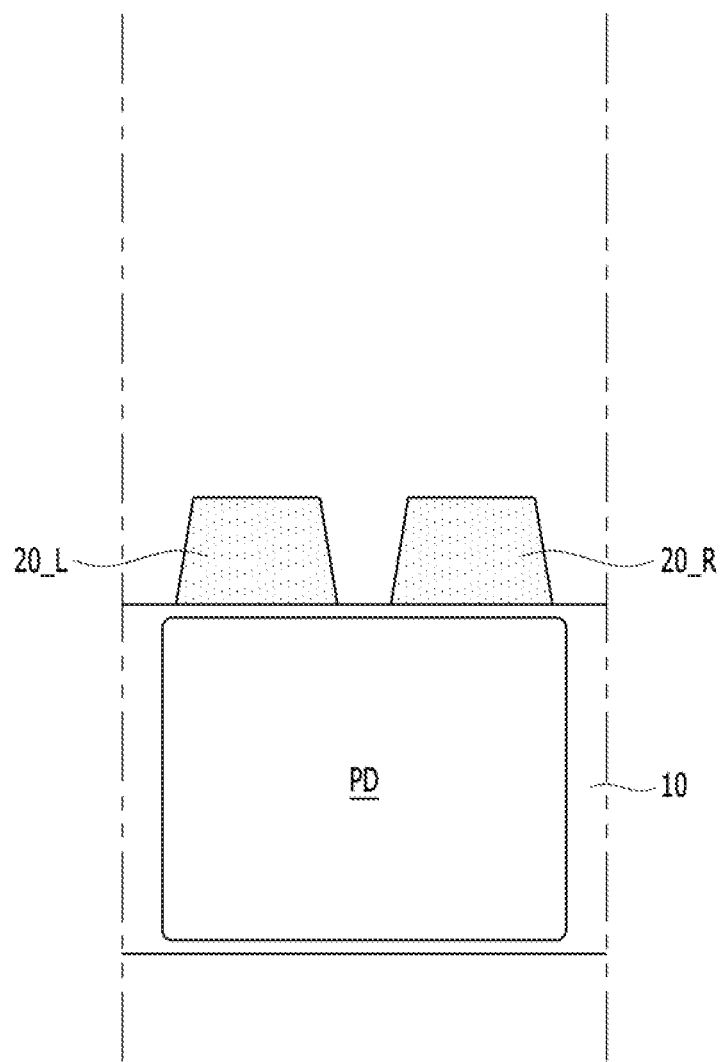

Referring to FIG. 8D, the method for forming pixels of the image sensor in accordance with the embodiment of the present invention may include: forming the light guides 20_L and 20_R over the first surface of the substrate 10 before the first inter-layer dielectric layer 15 is formed. In this embodiment of the present invention, the light guides 20_L and 20_R may be formed by sequentially performing a deposition process, a photolithography process, and an etch process. Subsequently, the method may include: forming the first inter-layer dielectric layer 15 that covers the light guides 20_L and 20_R forming the phase difference detectors 60_L and 60_R that are vertically overlapping and aligned with the light guides 20_L and 20_R, respectively, by referring to FIG. 8C, and forming the metal lines 70 and the second inter-layer dielectric layer 80 as shown in FIG. 7B, turning the substrate 10 upside down, and forming a color filter CF and a micro lens ML over the second surface of the substrate 10 as shown in FIG. 3B.

Figure 9A:
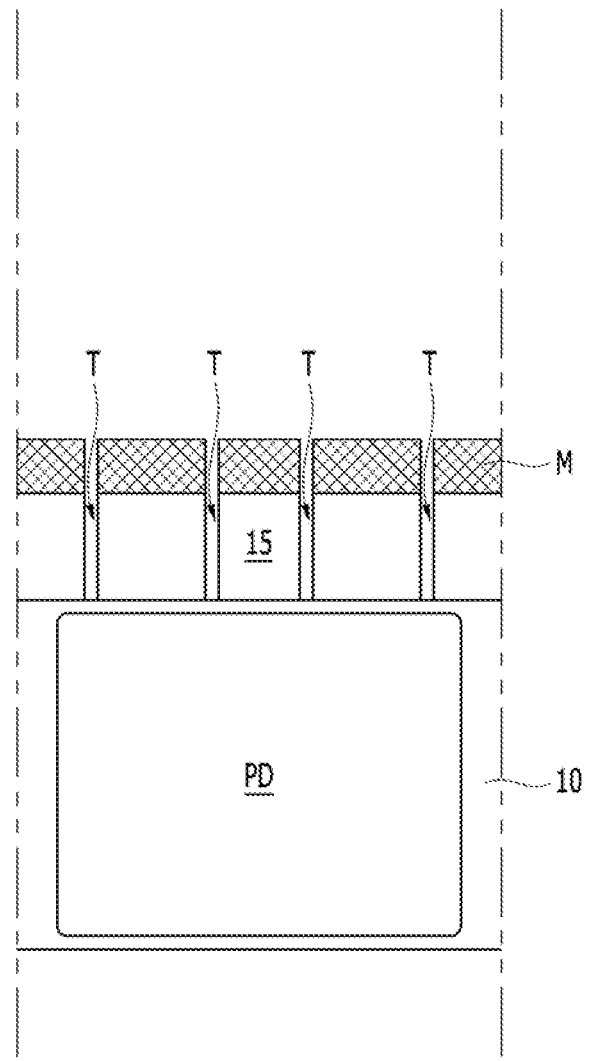

Referring to FIG. 9A, a method for forming pixels of an image sensor in accordance with an embodiment of the present invention may include: forming a main photodiode PD in a substrate 10, forming a first inter-layer dielectric layer 15 over a first surface of the substrate 10, performing a photolithography process to form a mask pattern M over the first inter-layer dielectric layer 15, and performing an etch process by using the mask pattern M as an etch mask so as to form trenches T in the first inter-layer dielectric layer 15. The trenches T may have a rim shape or a frame shape in a top view. Subsequently, the mask pattern M may be removed.

Figure 9B:
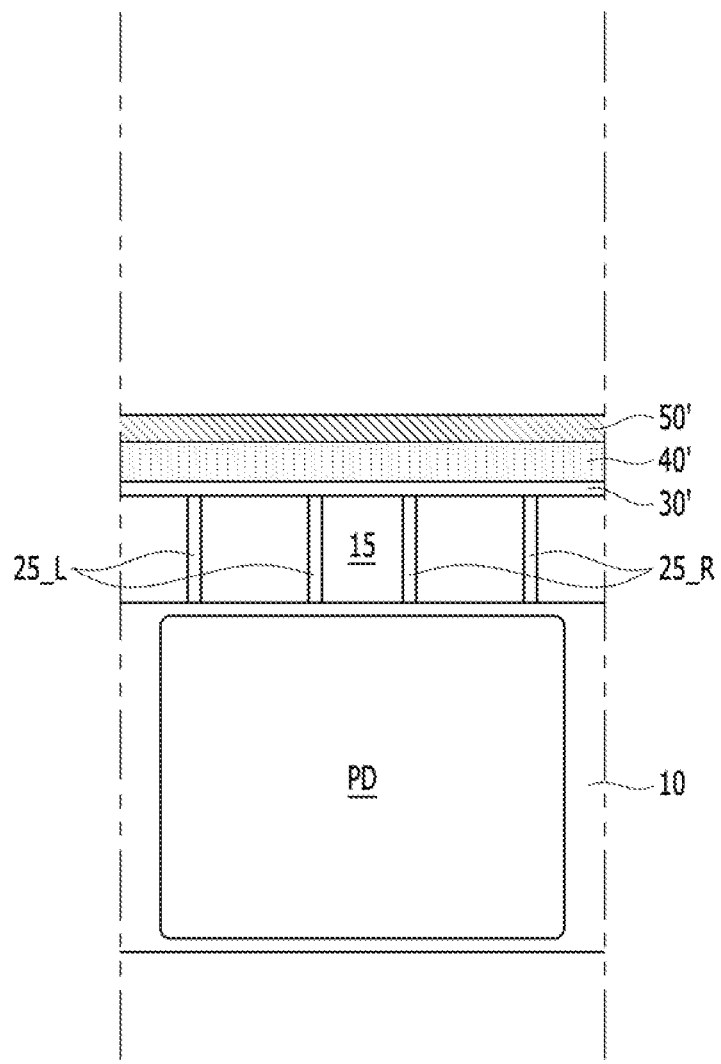

Referring to FIG. 9B, the method for forming pixels of the image sensor in accordance with the embodiment of the present invention may include: forming a top electrode material layer 30', a photodiode material layer 40', and a bottom electrode material layer 50' over the first inter-layer dielectric layer 15 by performing a deposition processes. The trenches T may be formed as the guide dams 25_L and 25_R. There may be air gap inside the guide dams 25_L and 25_R.

According to another embodiment of the present invention, the method may include: filling the trenches T with a material having a lower refractive index than that of the first inter-layer dielectric layer 15, forming the guide dams 25_L and 25_R by performing a planarization process such as Chemical Mechanical Polishing (CMP) and forming a top electrode material layer 30', a photodiode material layer 40', and a bottom electrode material layer 50' over the first inter-layer dielectric layer 15 and the guide dams 25_L and 25_R.

Figure 9C:
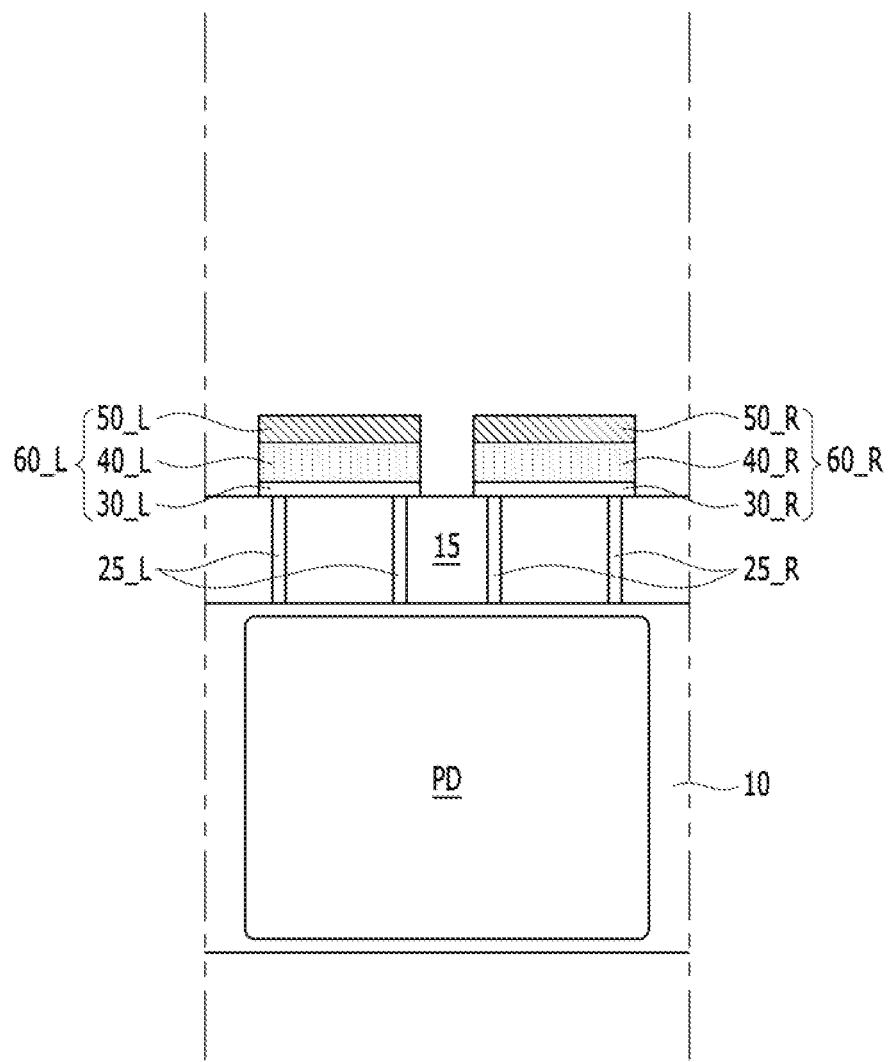

Referring to FIG. 9C, the method for forming pixels of the image sensor in accordance with the embodiment of the present invention may include: patterning the top electrode material layer 30' the photodiode material layer 40', and the bottom electrode material layer 50' through photolithography and etch processes to form phase difference detectors 60_L and 60_R. Subsequently, the method may include: forming metal lines 70 and a second inter-layer dielectric layer 80, turning the substrate 10 upside down, and forming a color filter CF and a micro lens ML over a second surface of the substrate 10 by referring to FIGS. 7C and 3C.

Figure 10A:
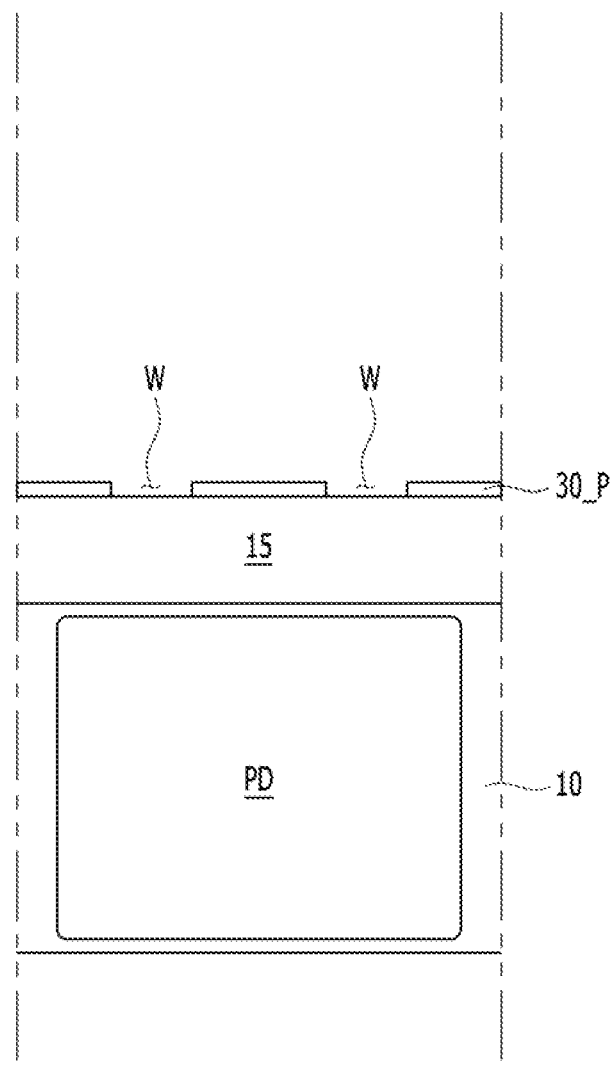

Referring to FIG. 10A, a method for forming pixels of an image sensor in accordance with an embodiment of the present invention may include: forming a main photodiode PD in a substrate 10, forming a first inter-layer dielectric layer 15 over a first surface of the substrate 10, and forming a preliminary top electrode 30_P over the first inter-layer dielectric layer 15. The preliminary top electrode 30_P may include square-shaped windows W in a top view. The process of forming the preliminary top electrode 30_P may include forming a transparent conductive material layer such as indium tin oxide (ITO) over the first inter-layer dielectric layer 15, and forming the windows W by performing photolithography and etch processes.

Figure 10B:
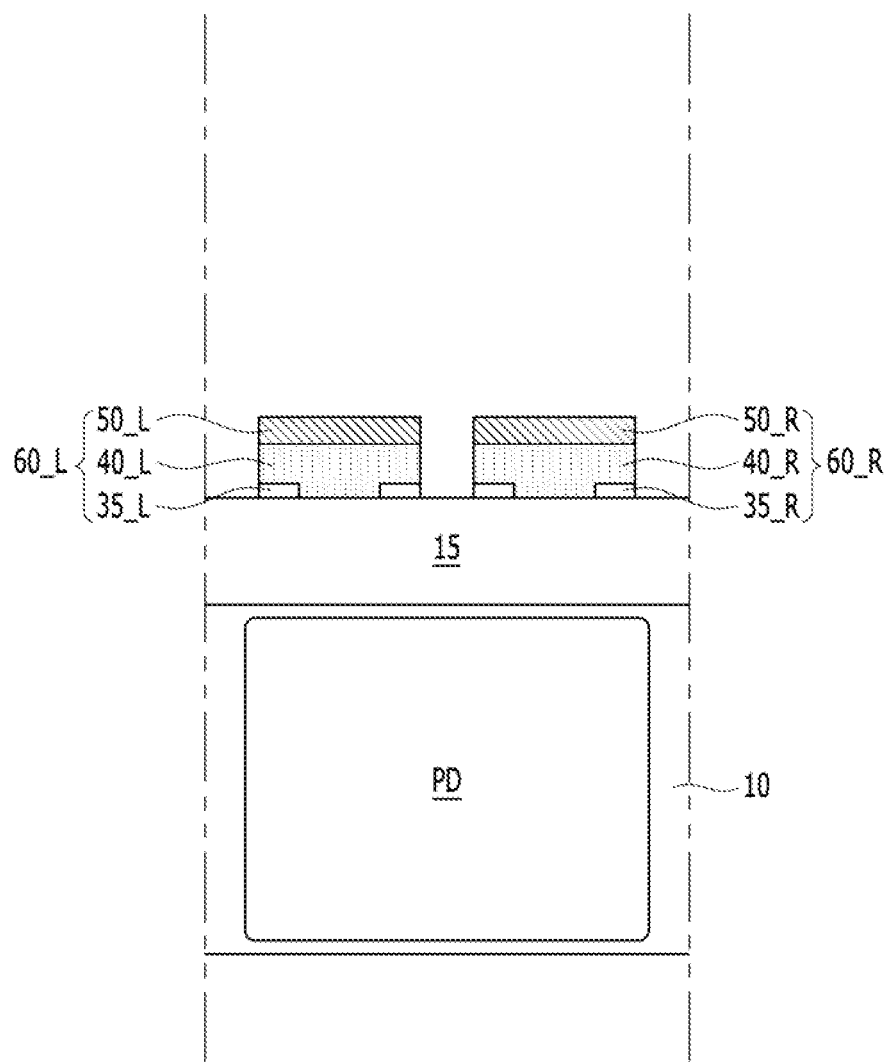

Referring to FIG. 10B, the method for forming pixels of the image sensor in accordance with the embodiment of the present invention may include: forming phase difference detectors 60_L and 60_R by performing the processes described above with reference to FIG. 7B. The central regions of buried photodiodes 40_L and 40_R do not cover top electrodes 35_L and 35_R and directly contact the first inter-layer dielectric layer 15. Subsequently, the method may include: forming metal lines 70 and a second inter-layer dielectric layer 80, turning the substrate 10 upside down, and forming a color filter CF and a micro lens ML over a second surface of the substrate 10 by referring to FIGS. 7C and 3D.

Figure 11A:
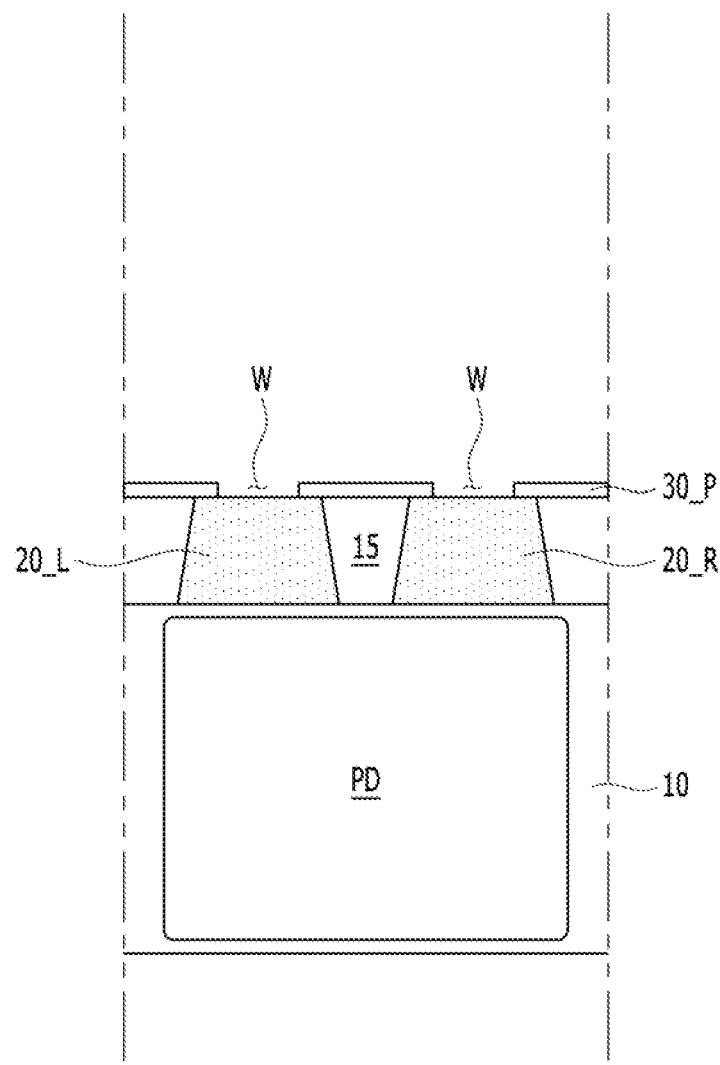

Referring to FIG. 11A, a method for forming pixels of an image sensor in accordance with an embodiment of the present invention may include: forming a main photodiode PD in a substrate 10, forming a first inter-layer dielectric layer 15 over a first surface of the substrate 10, forming light guides 20_L and 20_R in the first inter-layer dielectric layer 15, and forming a preliminary top electrode 30_P over the first inter-layer dielectric layer 15 and the light guides 20_L and 20_R by performing the processes described above with reference to FIGS. 8A, 8B and 10A. Each window W of the preliminary top electrode 30_P may be vertically overlapping and aligned with the light guides 20_L and 20_R.

Figure 11B:
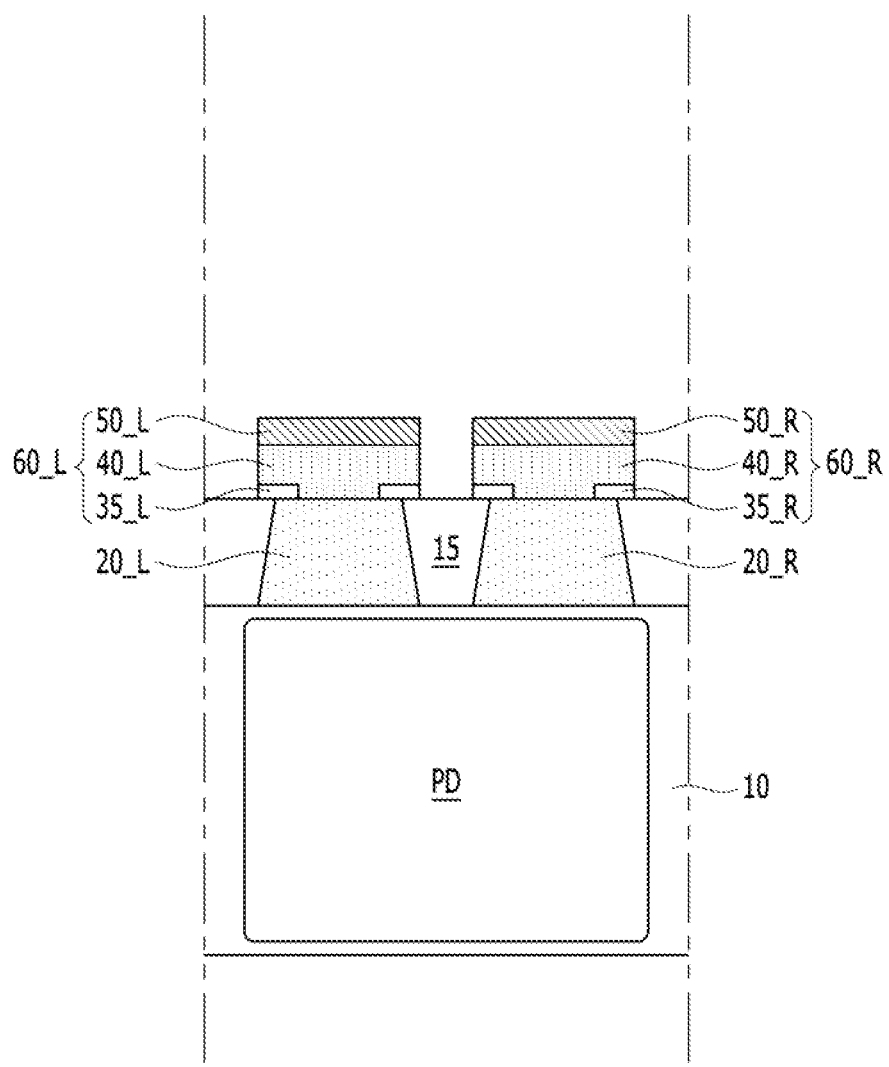

Referring to FIG. 11B, the method for forming pixels of the image sensor in accordance with the embodiment of the present invention may include: forming phase difference detectors 60_L and 60_R that are vertically overlapping and aligned with the light guides 20_L and 20_R, respectively, by performing the processes described above with reference to FIG. 10B. Subsequently, the method may include: forming metal lines 70 and a second inter-layer dielectric layer 80, turning the substrate 10 upside down, and forming a color filter CF and a micro lens ML over a second surface of the substrate 10 by referring to FIGS. 7C and 3E.

Figure 12A:
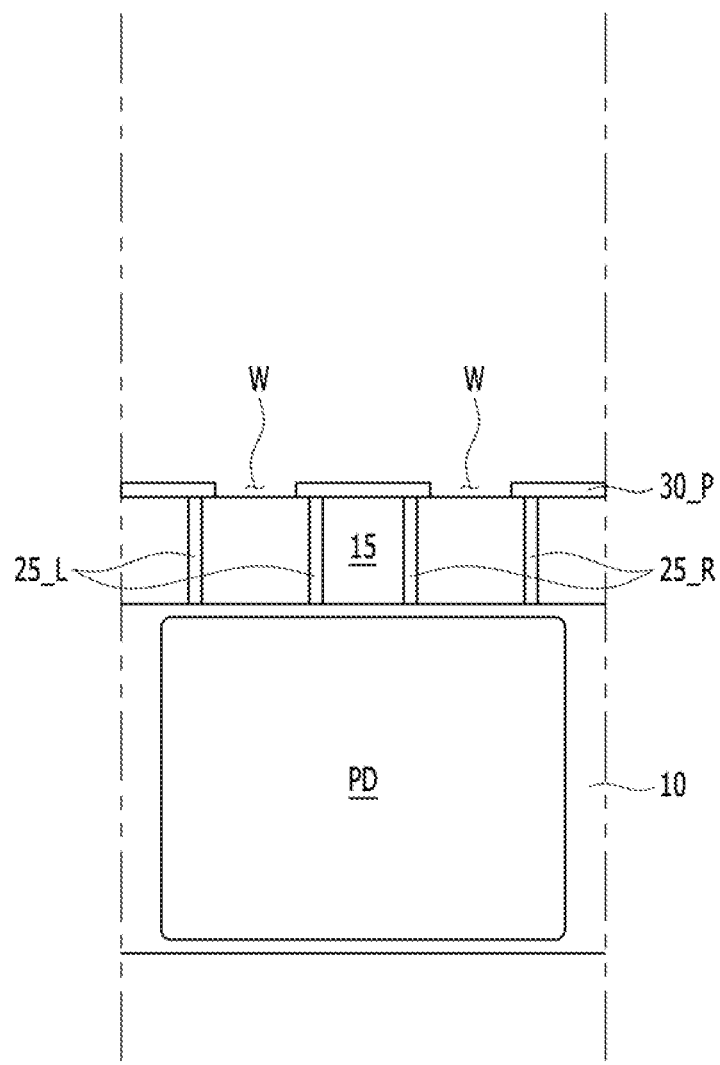

Referring to FIG. 12A, a method for forming pixels of an image sensor in accordance with an embodiment of the present invention may include: forming a main photodiode PD in a substrate 10, forming a first inter-layer dielectric layer 15 over a first surface of the substrate 10, forming guide dams 25_L and 25_R in the first inter-layer dielectric layer 15 through photolithography and etch processes, and forming a preliminary top electrode 30_P having windows W by performing the processes described above with reference to FIG. 9A.

Figure 12B:
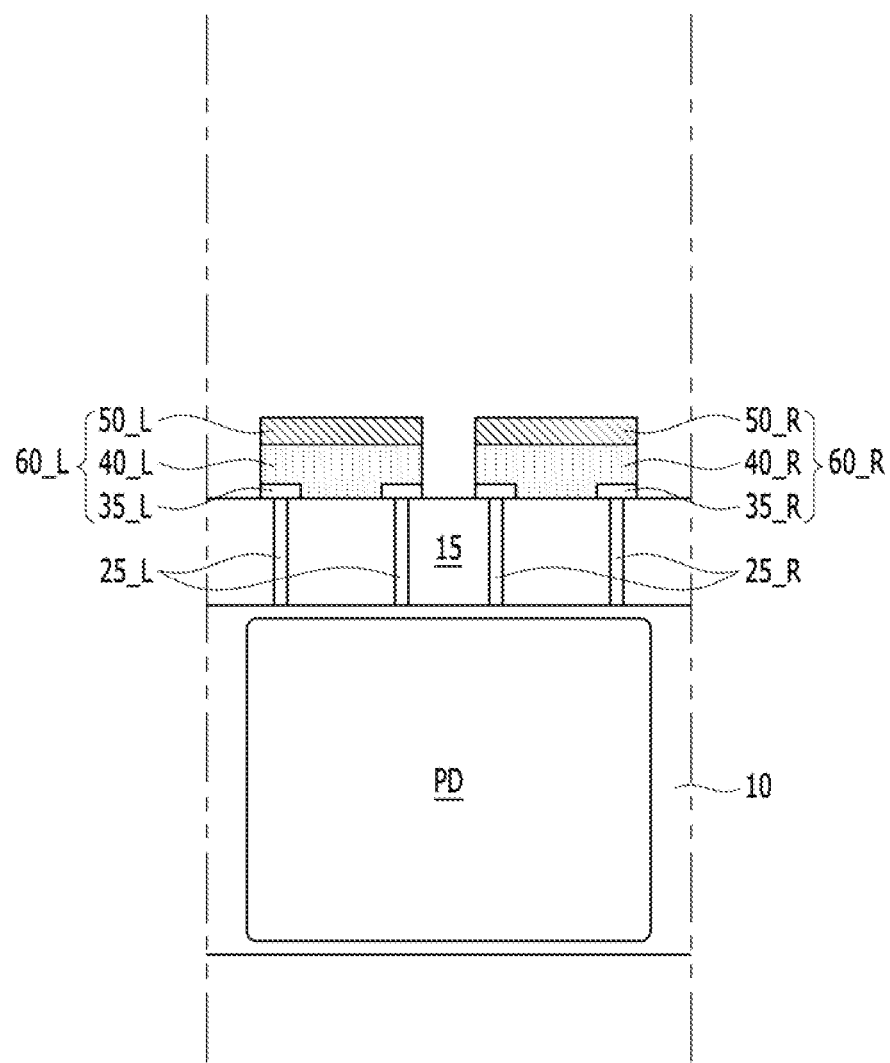

Referring to FIG. 12B, the method for forming pixels of the image sensor in accordance with the embodiment of the present invention may include: forming phase difference detectors 60_L and 60_R that are vertically overlapping and aligned with the guide dams 25_L and 25_R, respectively. Subsequently, the method may include: forming metal lines 70 and a second inter-layer dielectric layer 80, turning the substrate 10 upside down, and forming a color filter CF and a micro lens ML over a second surface of the substrate 10 by referring to FIGS. 7C and 3F.

Figure 13A:
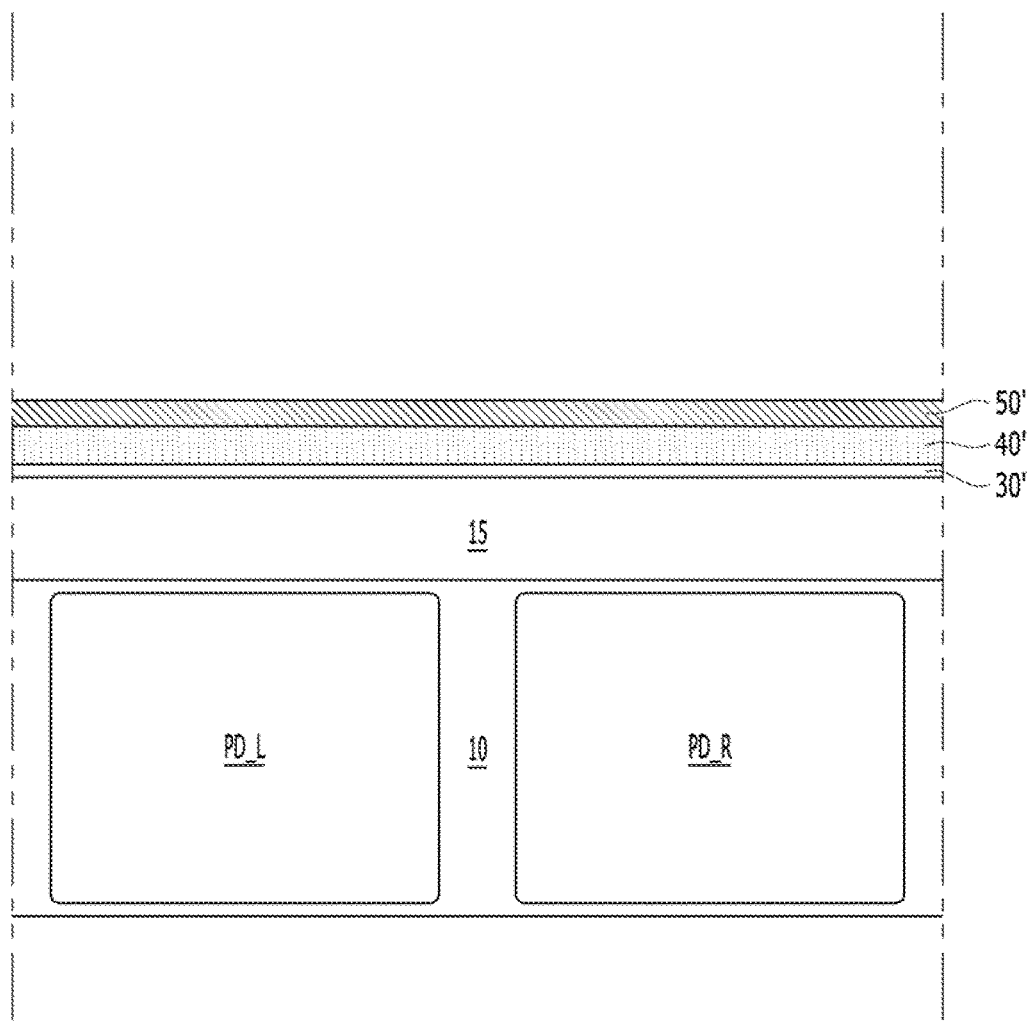
FIGS. 13A to 18B are horizontal cross-sectional views describing a method for forming pixel pairs of diverse image sensors in accordance with embodiments of the present invention.

FIGS. 13A to 18B are horizontal cross-sectional views describing a method for forming pixel pairs of diverse image sensors in accordance with diverse embodiments of the present invention. Referring to FIG. 13A, a method for forming pixel pairs of an image sensor in accordance with an embodiment of the present invention may include: forming left and right main photodiodes PD_L and PD_R in a substrate 10 through an ion implantation process, forming pixel transistors (not shown), forming a first inter-layer dielectric layer 15 over a first surface of the substrate 10, forming a top electrode material layer 30', a photodiode material layer 40', and a bottom electrode material layer 50' over the first inter-layer dielectric layer 15. The top electrode material layer 30' may include a transparent conductive material such as indium tin oxide (ITO). The photodiode material layer 40' may include amorphous or polycrystalline silicon. The bottom electrode material layer 50' may include a metal such as tungsten (W) and/or a metal compound such as titanium nitride (TiN).

Figure 13B:
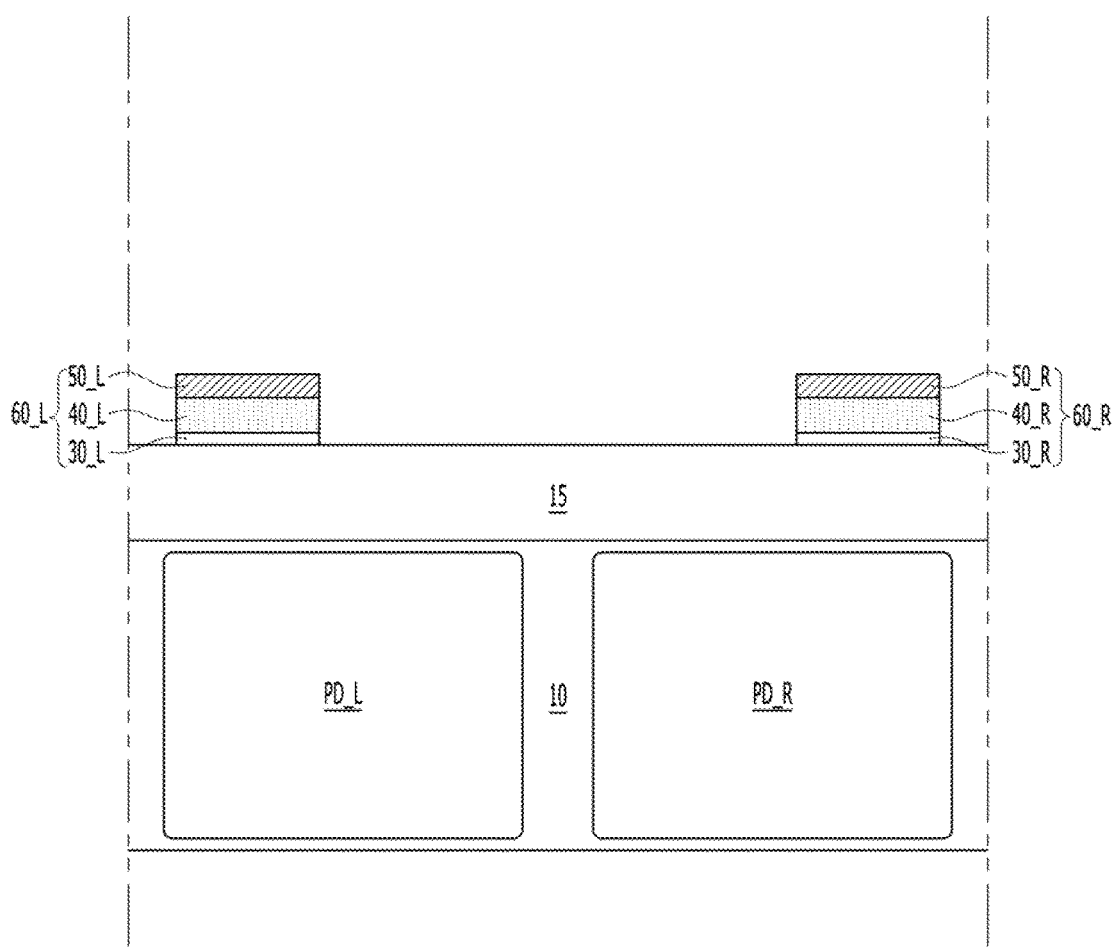

Referring to FIG. 13B, the method for forming pixel pairs of the image sensor in accordance with the embodiment of the present invention may include: forming phase difference detectors 60_L and 60_R by patterning the top electrode material layer 30', the photodiode material layer 40', and the bottom electrode material layer 50'. The phase difference detectors 60_L and 60_R may include a left phase difference detector 60_L that is vertically overlapping and aligned with a left side region of the left main photodiode PD_L and a right phase difference detector 60_R that is vertically overlapping and aligned with a right side region of the right main photodiode PD_R.

Figure 13C:
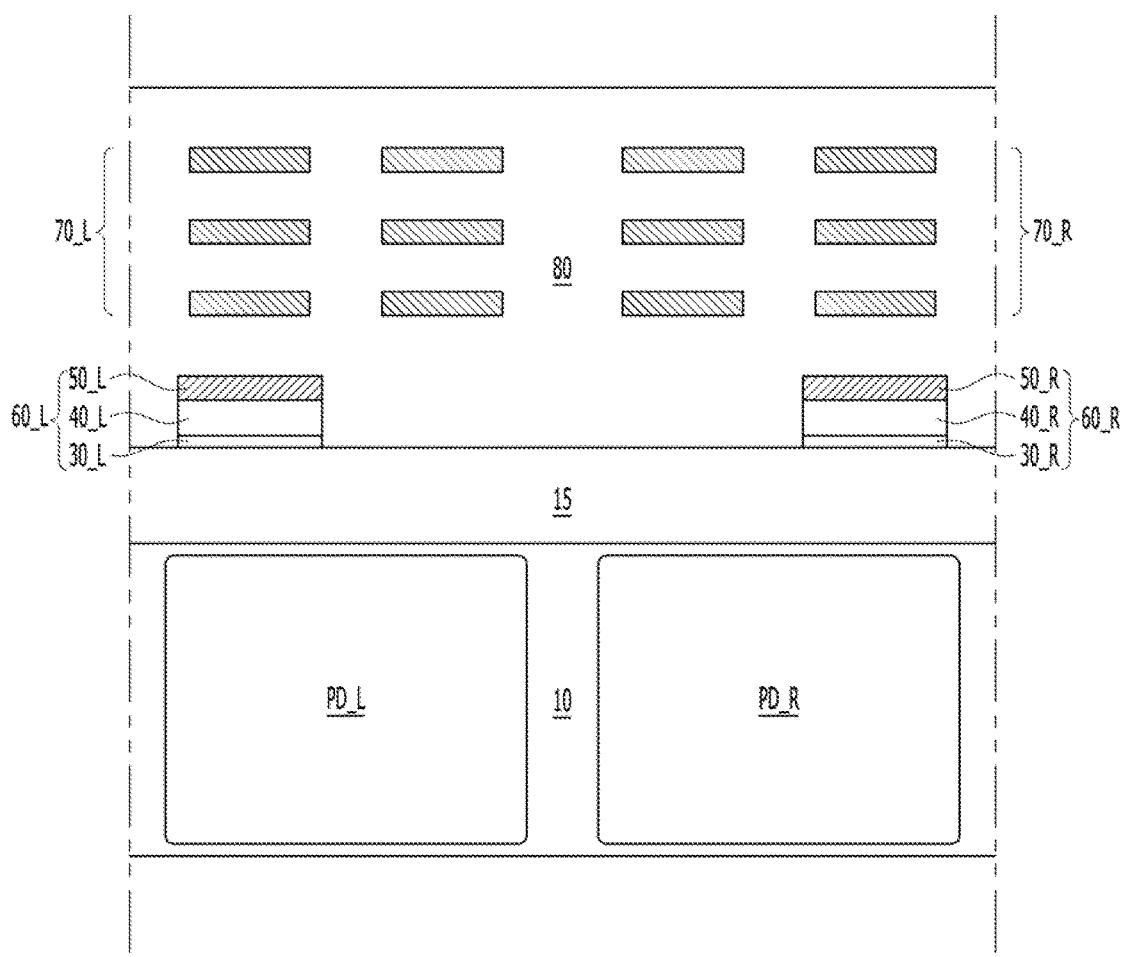

Referring to FIG. 13C, the method for forming pixel pairs of the image sensor in accordance with the embodiment of the present invention may include: forming left metal lines 70_L that are vertically overlapping and aligned with the left main photodiode PD_L, right metal lines 70_R that are vertically overlapping and aligned with the right main photodiode PD_R, and a second inter-layer dielectric layer 80 that covers the left and right metal lines 70_L and 70_R. The left and right metal lines 70_L and 70_R may include a metal such as tungsten (W) and/or a metal compound such as titanium nitride (TiN). The second inter-layer dielectric layer 80 may include at least one among a silicon oxide, a silicon nitride, a silicon oxynitride, and combinations thereof. Subsequently, the method may include: turning the substrate 10 upside down and forming a color filter CF and a micro lens ML over a second surface of the substrate 10 by referring to FIG. 5A.

Figure 14A:
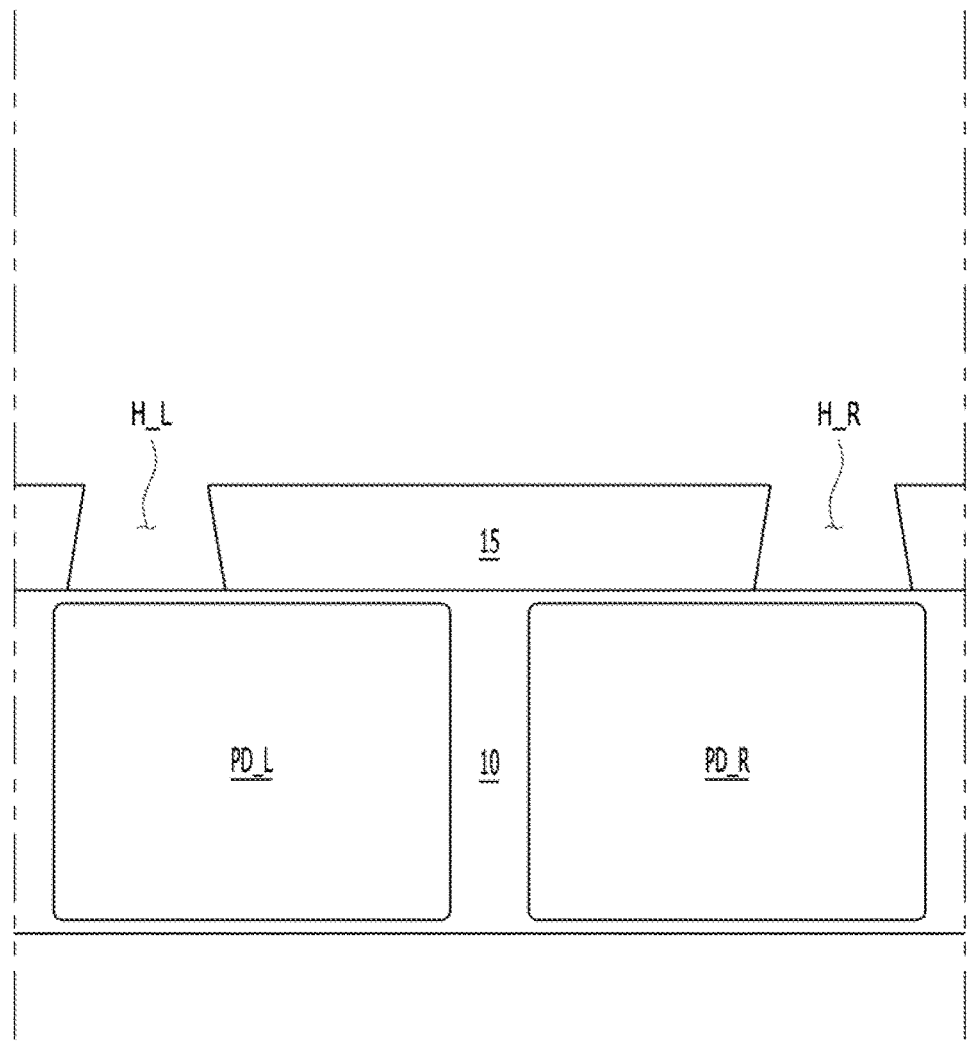

Referring to FIG. 14A, a method for forming pixel pairs of an image sensor in accordance with an embodiment of the present invention may include: forming left and right main photo diodes PD_L and PD_R in a substrate 10, forming a first inter-layer dielectric layer 15 over a first surface of the substrate 10, and forming a left hole H_L that is vertically overlapping and aligned with a left side region of the left main photodiode PD_L and a right hole H_R that is vertically overlapping and aligned with a right side region of the right main photodiode PD_R through photolithography and etch processes.

Figure 14B:
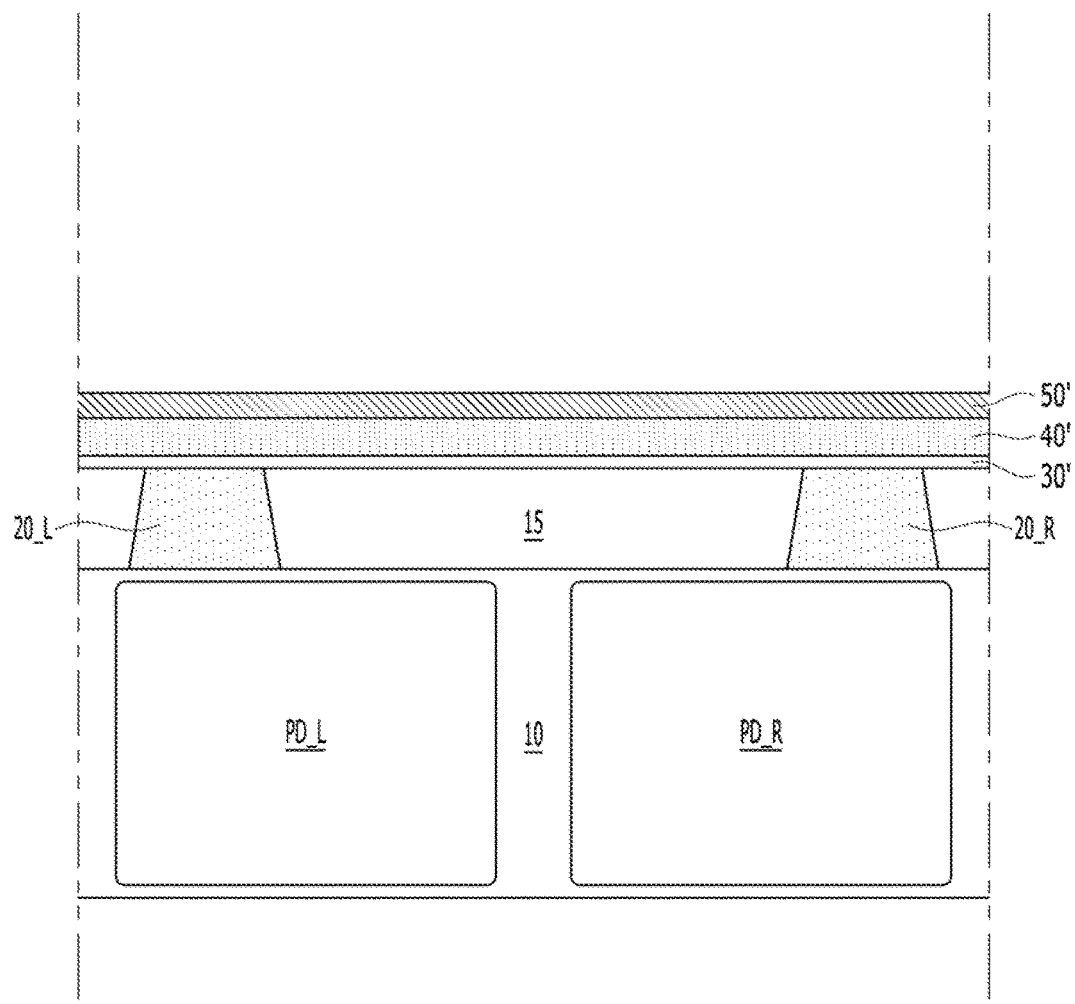

Referring to FIG. 14B, the method for forming pixel pairs of the image sensor in accordance with the embodiment of the present invention may include: forming left and right light guides 20_L and 20_R by filling the left and right holes H_L and H_R with a material having a higher refractive index than the first inter-layer dielectric layer 15, and forming a top electrode material layer 30', a photodiode material layer 40', and a bottom electrode material layer 50' over the first inter-layer dielectric layer 15 and the light guides 20_L and 20_R through a deposition process. Subsequently, the method may include: forming left and right phase difference detectors 60_L and 60_R forming left and right metal lines 70_L and 70_R, forming a second inter-layer dielectric layer 80, turning the substrate 10 upside down, and forming color filters CF_L and CF_R and micro lenses ML_L and ML_R over the second surface of the substrate 10 by referring to FIGS. 13B, 13C and 5B.

Figure 14C:
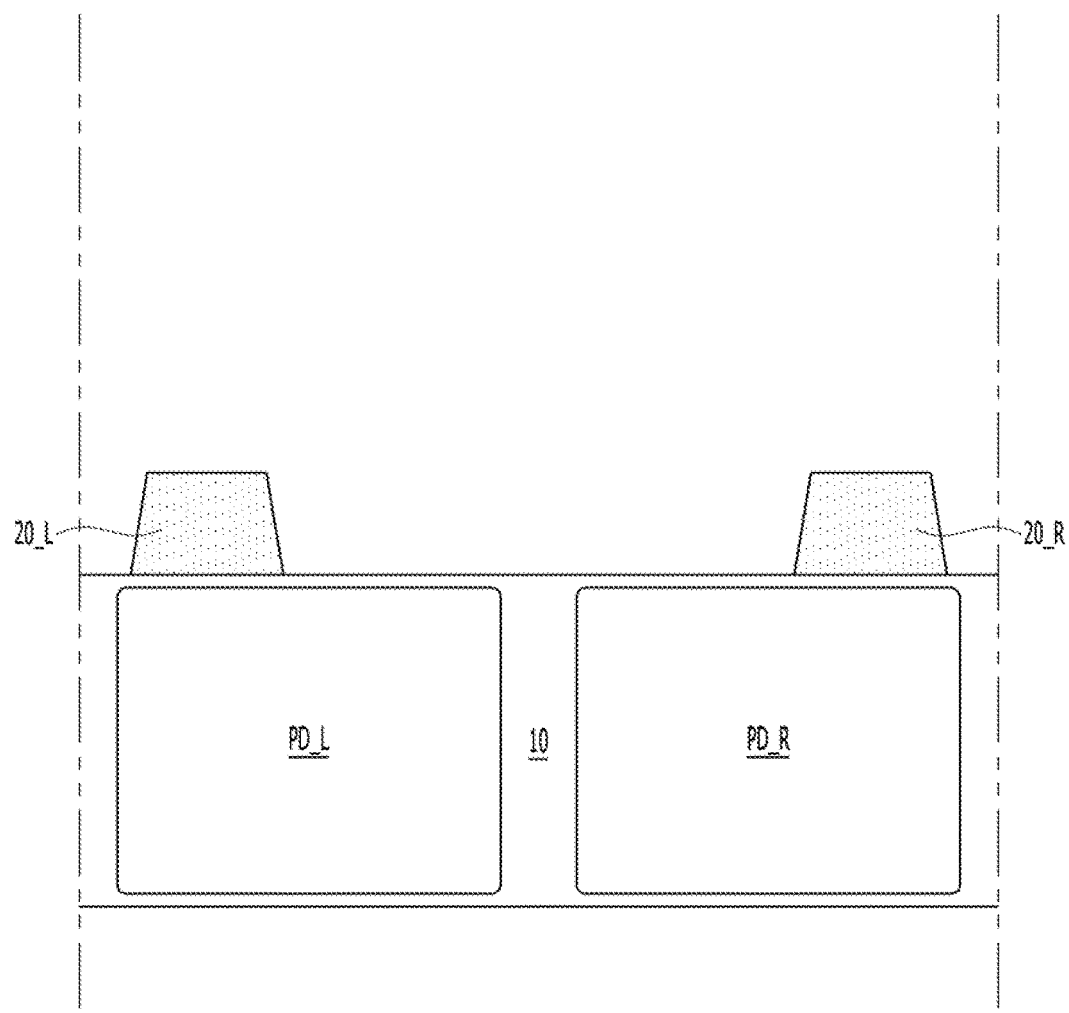

Referring to FIG. 14C, the method for forming pixel pairs of the image sensor in accordance with the embodiment of the present invention may include: forming the left and right light guides 20_L over the first surface of the substrate 10 before the first inter-layer dielectric layer 15 is formed. In this embodiment of the present invention, the light guides 20_L and 20_R may be formed by sequentially performing a deposition process, a photolithography process, and an etch process.

Subsequently, the method may include: forming the first inter-layer dielectric layer 15 that covers the light guide 20_L and 20_R, and forming the metal lines 70_L and 70_R and a second inter-layer dielectric layer 80, turning the substrate 10 upside down, and forming color filters CF_L and CF_R and micro lenses ML_L and ML_R over the second surface of the substrate 10 by referring to FIGS. 13B, 13C and 5B.

Figure 15A:
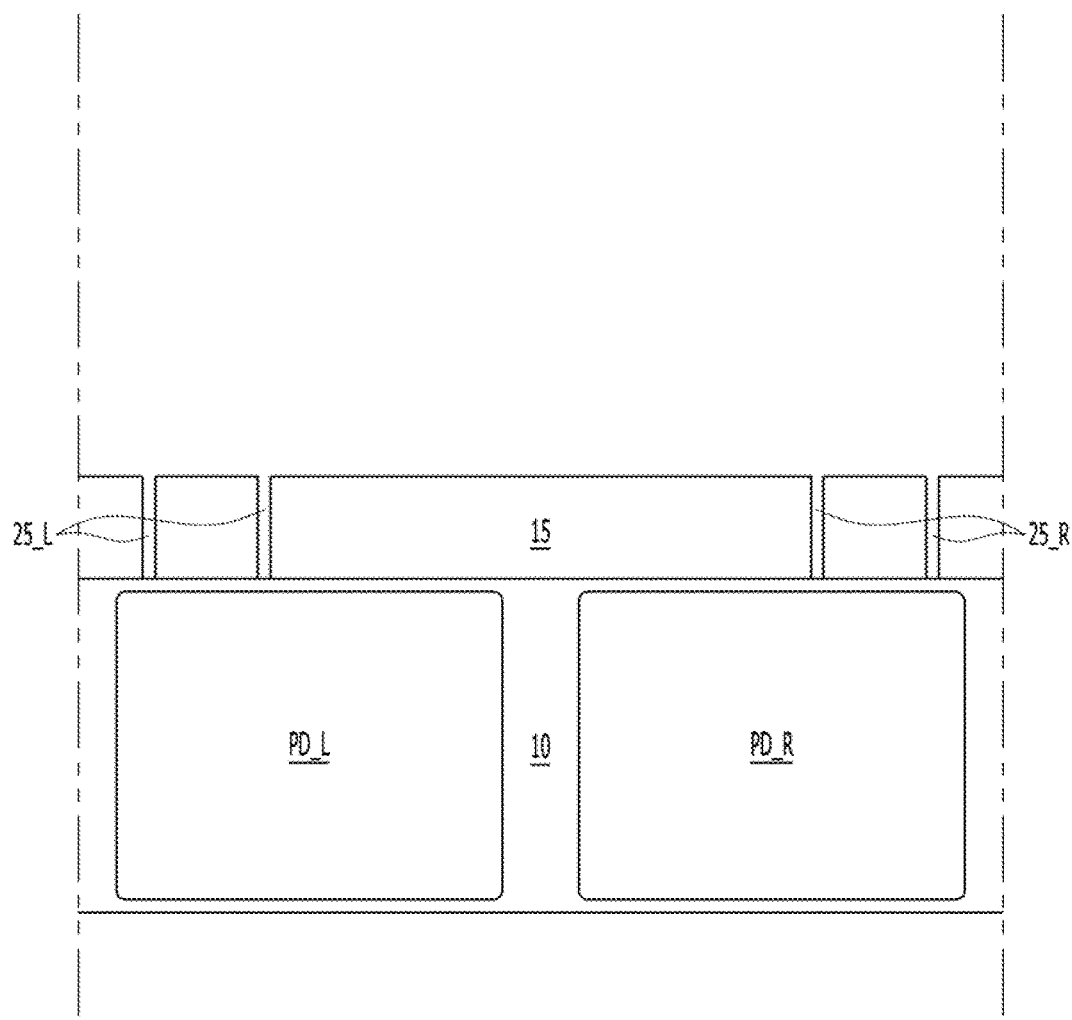

Referring to FIG. 15A, a method for forming pixel pairs of an image sensor in accordance with an embodiment of the present invention may include: forming left and right main photodiodes PD_L and PD_R in a substrate 10, forming a first inter-layer dielectric layer 15 over a first surface of the substrate 10, and forming a left guide dam 25_L that is vertically overlapping and aligned with a left side region of the left main photodiode PD_L and a right guide dam 25_R that is vertically overlapping and aligned with a right side region of the right main photodiode PD_R through photolithography and etch processes. Each of the left and right guide dams 25_L and 25_R may include air gap. According to another embodiment of the present invention, each of the left and right guide dams 25_L and 25_R may include a material having a lower refractive index than the first inter-layer dielectric layer 15.

Figure 15B:
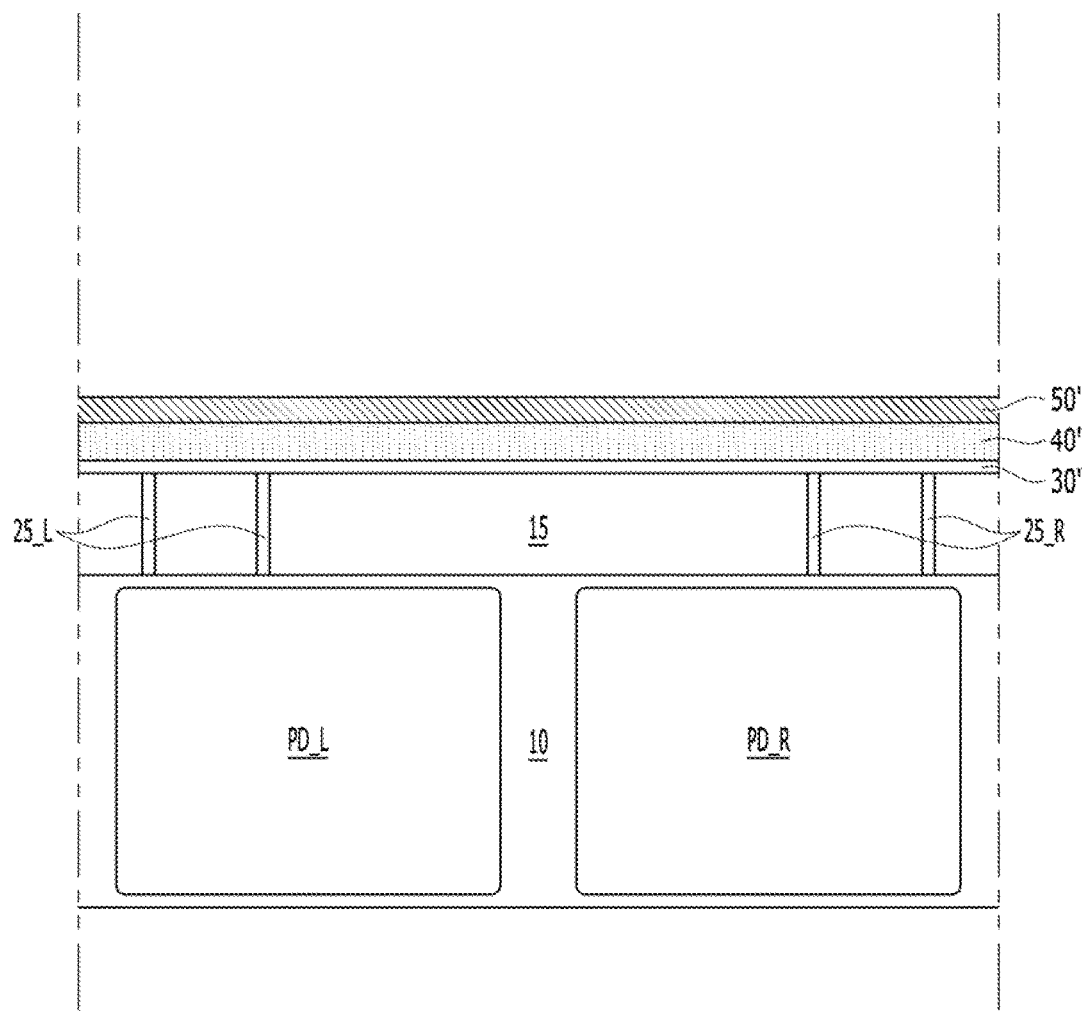

Referring to FIG. 15B, the method for forming pixel pairs of the image sensor in accordance with the embodiment of the present invention may include: forming a top electrode material layer 30', a photodiode material layer 40', and a bottom electrode material layer 50' over the first inter-layer dielectric layer 15 and the left and right guide dams 25_L and 25_R through a deposition process. Subsequently, the method may include: forming left and right phase difference detectors 60_L and 60_R, forming left and right metal lines 70_L and 70_R, forming a second inter-layer dielectric layer 80, turning the substrate 10 upside down, and forming color filters CF_L and CF_R and micro lenses ML_L and ML_R over the second surface of the substrate 10 by referring to FIGS. 13B, 13C and 5C.

Figure 16A:
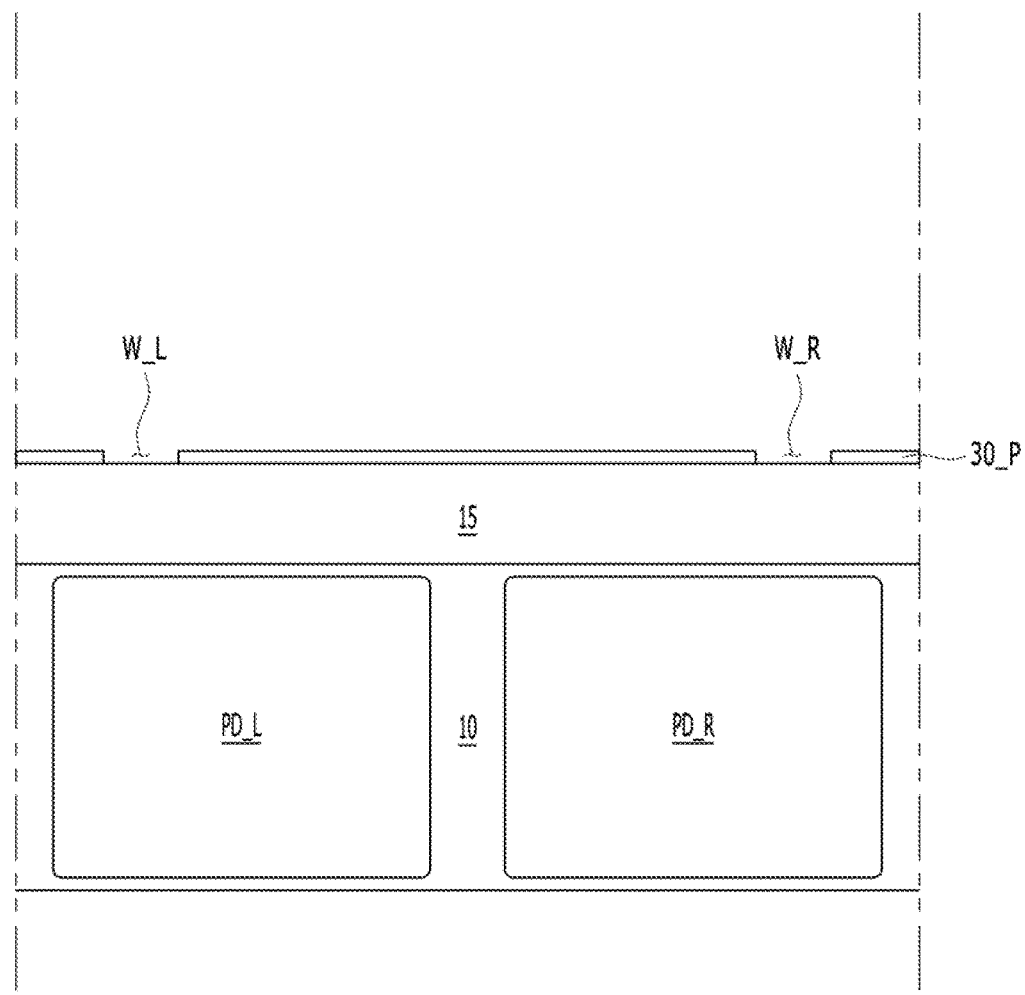

Referring to FIG. 16A, a method for forming pixel pairs of an image sensor in accordance with an embodiment of the present invention may include: forming left and right main photodiodes PD_L and PD_R in a substrate 10 forming a first inter-layer dielectric layer 15 over a first surface of the substrate 10, and forming a preliminary top electrode 30_P over the first inter-layer dielectric layer 15. The preliminary top electrode 30_P may include a left window W_L that is vertically overlapping and aligned with a left side region of the left main photodiode PD_L and a right window W_R that is vertically overlapping and aligned with a right side region of the right main photodiode PD_R. A method for forming pixel pairs of an image sensor in accordance with another embodiment of the present invention may further include: filling the inside of the left and right windows W_L and W_R with the same material as the first inter-layer dielectric layer 15 and performing a planarization process.

Figure 16B:
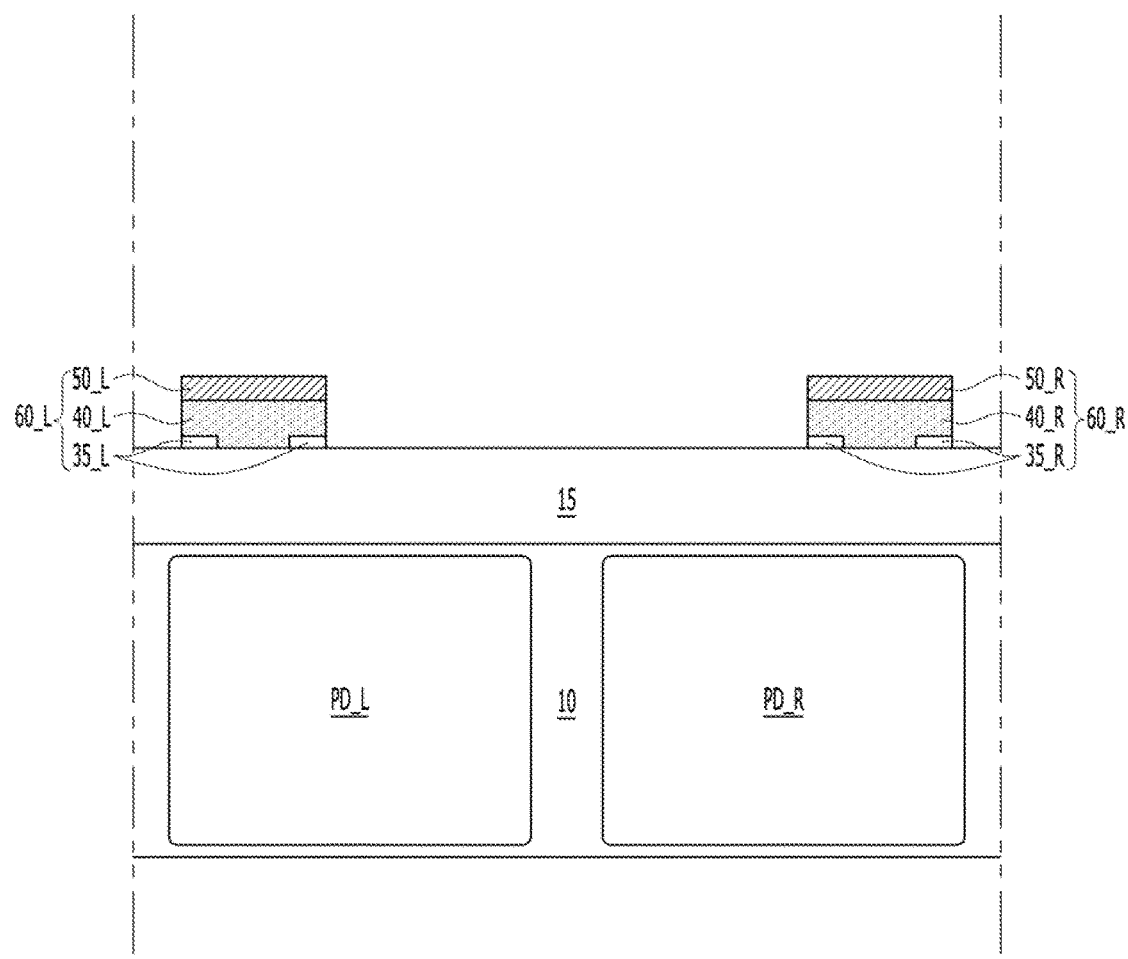

Referring to FIG. 16B, the method for forming pixel pairs of the image sensor in accordance with the embodiment of the present invention may include: forming a photodiode material layer and a bottom electrode material layer over the preliminary top electrode 30_P, and forming a left phase difference detector 60_L that is vertically overlapping and aligned with a left side region of the left main photodiode PD_L and a right phase difference detector 60_R that is vertically overlapping and aligned with a right side region of the right main photodiode PD_R by performing photolithography and etch processes. Subsequently, the method may include: forming left and right metal lines 70_L and 70_R, forming a second inter-layer dielectric layer 80, turning the substrate 10 upside down, and forming color filters CF_L and CF_R and micro lenses ML_L and ML_R over the second surface of the substrate 10 by referring to FIGS. 13B, 13C and 5D.

Figure 17A:
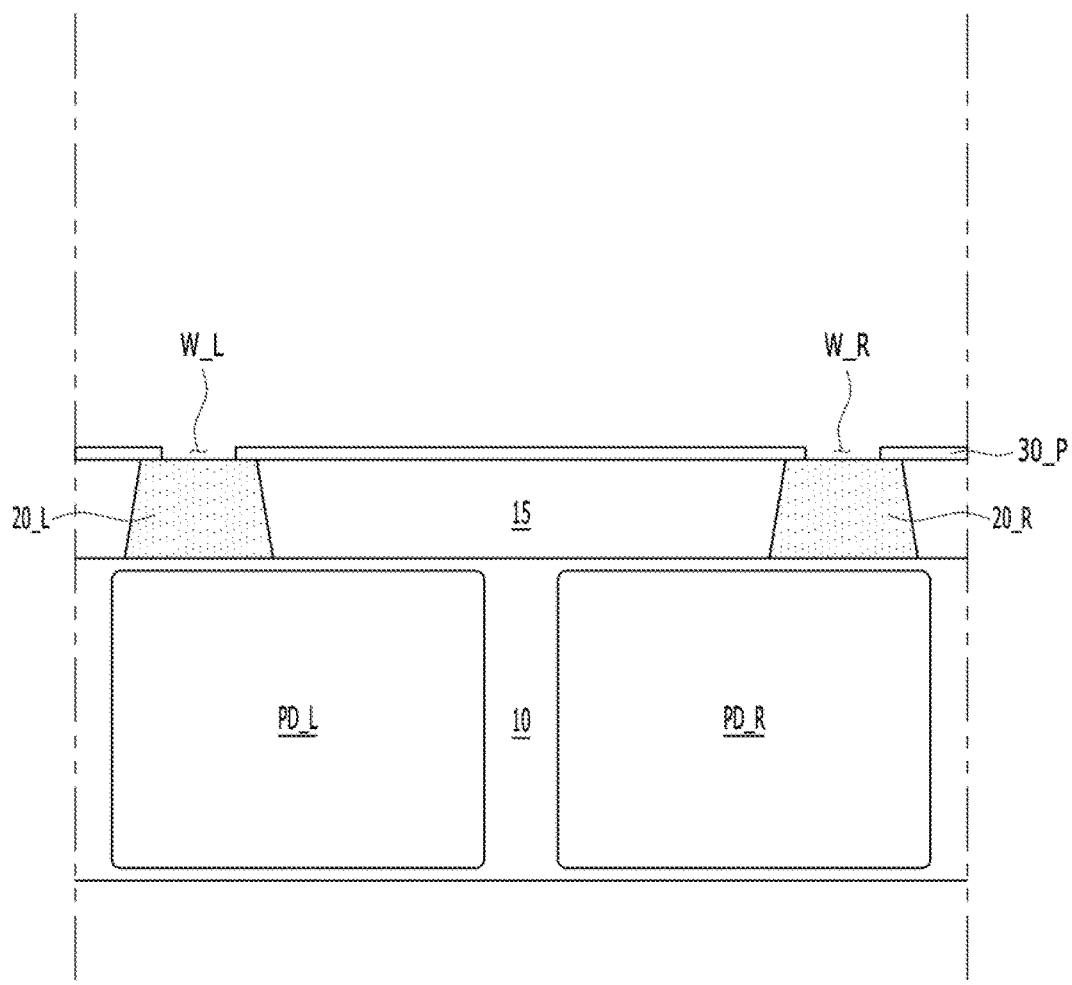

Referring to FIG. 17A, a method for forming pixel pairs of an image sensor in accordance with an embodiment of the present invention may include: forming left and right main photodiodes PD_L and PD_R in a substrate 10, forming a first inter-layer dielectric layer 15 over a first surface of the substrate 10, forming a left light guide 20_L that is vertically overlapping and aligned with a left side region of the left main photodiode PD_L and a right light guide 20_R that is vertically overlapping and aligned with a right side region of the right main photodiode PD_R, and forming a preliminary top electrode 30_P over the first inter-layer dielectric layer 15 and the left and right light guides 20_L and 20_R. The preliminary top electrode 30_P may include a left window W_L that is vertically overlapping and aligned with a left side region of the left main photodiode PD_L and the left light guide 20_L and a right window W_R that is vertically overlapping and aligned with a right side region of the right main photodiode PD_R and the right light guide 20_R. A method for forming pixel pairs of an image sensor in accordance with another embodiment of the present invention may further include: filling the inside of the left and right windows W_L and W_R with the same material as the first inter-layer dielectric layer 15 and performing a planarization process.

Figure 17B:
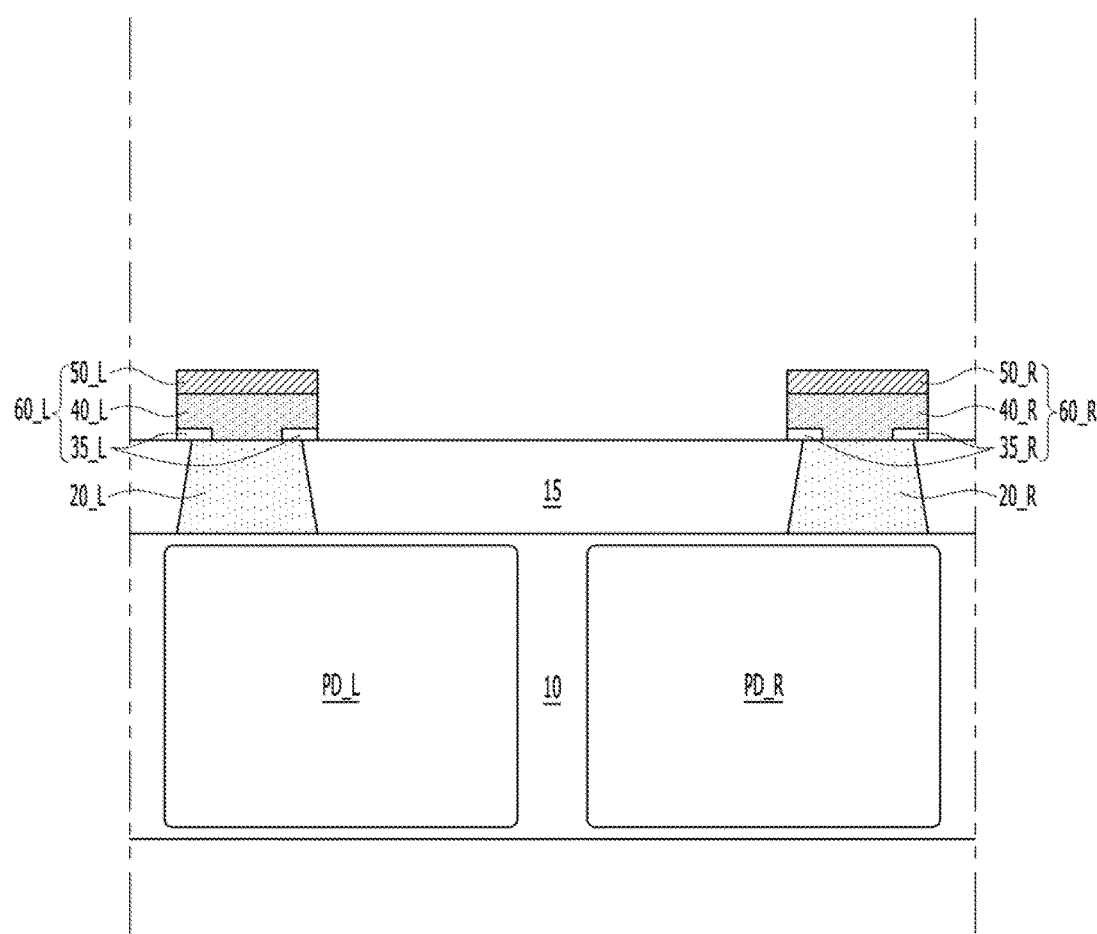

Referring to FIG. 17B, the method for forming pixel pairs of the image sensor in accordance with the embodiment of the present invention may include forming a left phase difference detector 60_L that vertically overlapping and aligned with a left side region of the left main photodiode PD_L and the left light guide 20_L and a right phase difference detector 60_R that is vertically overlapping and aligned with a right side region of the right main photodiode PD_R and the right light guide 20_R. Subsequently, the method may include: forming left and right metal lines 70_L and 70_R, forming a second inter-layer dielectric layer 80, turning the substrate 10 upside down, and forming color filters CF_L and CF_R and micro lenses ML_L and ML_R over the second surface of the substrate 10 by referring to FIGS. 13B, 13C and 5E.

Figure 18A:
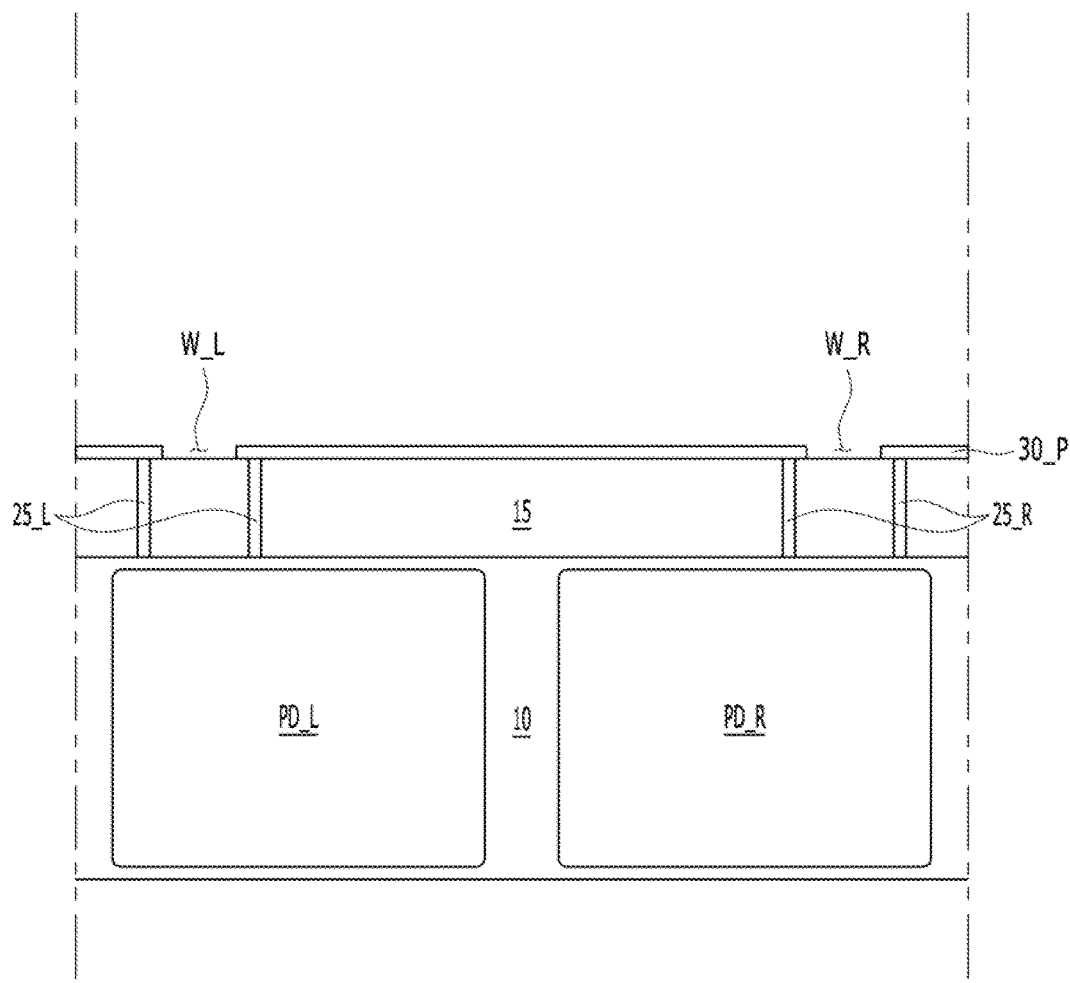

Referring to FIG. 18A, a method for forming pixel pairs of an image sensor in accordance with an embodiment of the present invention may include: forming left and right main photodiodes PD_L and PD_R in a substrate 10, forming a first inter-layer dielectric layer 15 over a first surface of the substrate 10, forming left and right guide dams 25_L and 25_R and forming a preliminary top electrode 30_P over the first inter-layer dielectric layer 15 and the left and right guide dams 25_L and 25_R. The preliminary top electrode 30_P may include a left window W_L that is vertically overlapping and aligned with a left side region of the left main photodiode PD_L and the internal region of the left guide dam 25_L and a right window W_R that is vertically overlapping and aligned with a right side region of the right main photodiode PD_R and the internal region of the right guide dam 25_R. A method for forming pixel pairs of an image sensor in accordance with another embodiment of the present invention may further include: filling the inside of the left and right windows W_L and W_R with the same material as the first inter-layer dielectric layer 15 and performing a planarization process.

Figure 18B:
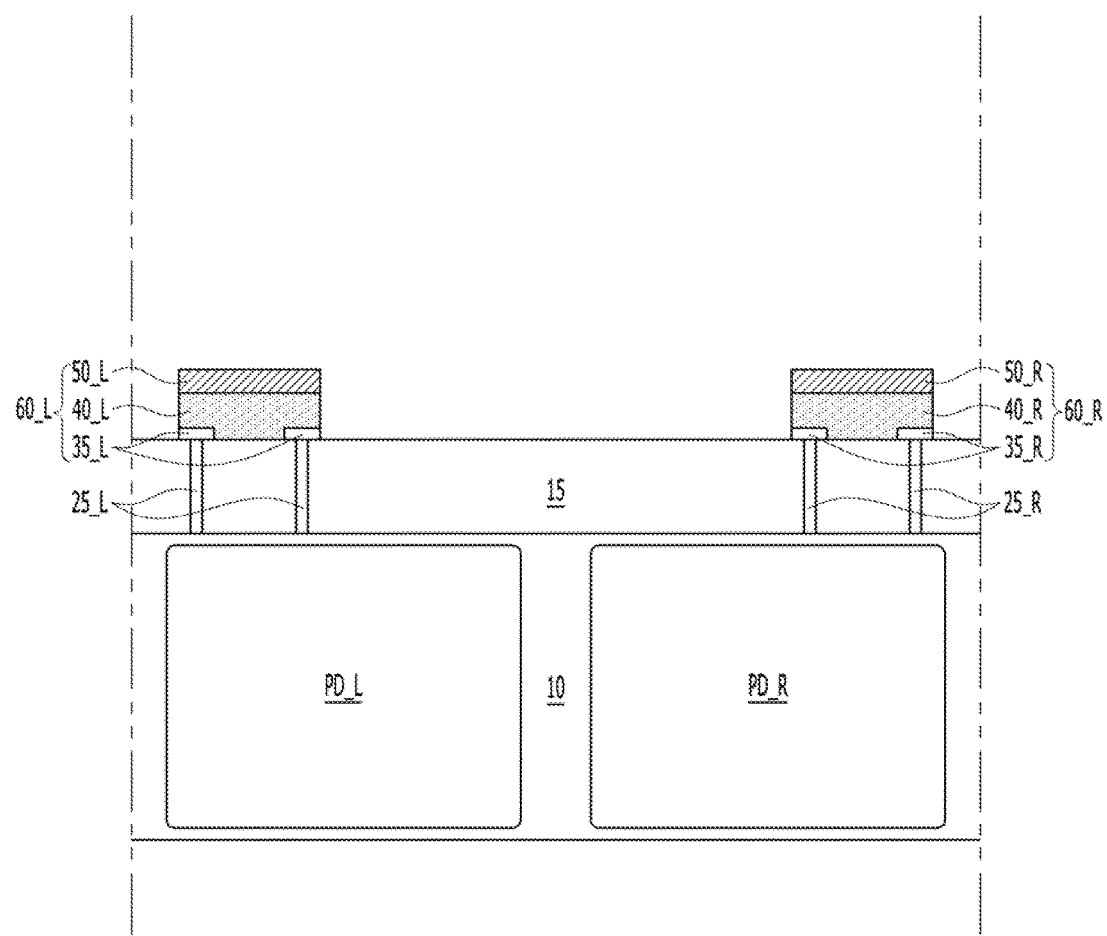

Referring to FIG. 18B, the method for forming pixel pairs of the image sensor in accordance with the embodiment of the present invention may include: forming a left phase difference detector 60_L that is vertically overlapping and aligned with a left side region of the left main photodiode PD_L and the left guide dam 25_L and a right phase difference detector 60_R that is vertically overlapping and aligned with a right side region of the right main photodiode PD_R and the right guide dam 25_R. Subsequently, the method may include: forming left and right metal lines 70_L and 70_R, forming a second inter-layer dielectric layer 80 turning the substrate 10 upside down, and forming color filters CF_L and CF_R and micro lenses ML_L and ML_R over the second surface of the substrate 10 by referring to FIGS. 13C and 5F.

Figure 19:
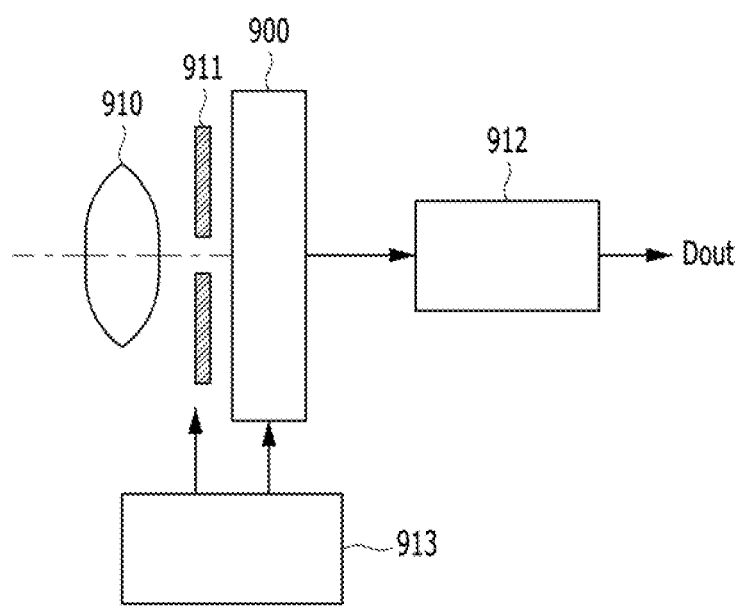
FIG. 19 is a diagram illustrating an electronic device including an image sensor with a phase difference detector in accordance with an embodiment of the present invention.

FIG. 19 is a diagram illustrating an electronic device including at least one image sensor among image sensors provided with phase difference detectors 60_L and 60_R in accordance with diverse embodiments of the present invention. Referring to FIG. 19, the electronic device including at least one image sensor among image sensors provided with phase difference detectors 60_L and 60_R, in accordance with diverse embodiments of the present invention may include a camera that may take a still image or a moving picture. The electronic device may include an optical system 910 or an optical lens, a shutter unit 911, an image sensor 900, a driving unit 913 for controlling and driving the image sensor 900 and the shutter unit 911, and a signal processing unit 912.

The optical system 910 guides image light, which is incident light, from a subject to a pixel array (refer to a reference numeral '100' of FIG. 1) of the image sensor 900. The optical system 910 may include a plurality of optical lenses. The shutter unit 911 controls how long the image sensor 900 is exposed to the incident light and how long the image sensor 900 is shut off from the incident light. The driving unit 913 controls a transfer operation of the image sensor 900 and a shutting operation of the shutter unit 911. The signal processing unit 912 performs diverse kinds of signal processing with respect to the signals outputted from the image sensor 900. After the signal processing, image signals Dout are stored in a storage medium such as a memory or outputted to a monitor.

According to an embodiment of the present invention, pixels can be used to detect phase differences since each of the pixels has a left phase difference detector disposed on a left side of the pixel and a right phase difference detector disposed on a right side of the pixel. For example, the left phase difference detector can analyze the intensity of light that enters from the left top at a slanted angle, and the right phase difference detector can analyze the intensity of light that enters from the right top at a slanted angle. Therefore, image sensors in accordance with embodiments of the present invention can detect the phase difference of light by using only one pixel and thereby realize an auto-focus function.

According to an embodiment of the present invention, pixel pairs can be used to detect phase difference since each of the pixel pairs has left and right phase difference detectors that are vertically overlapping and aligned with the left and right main photodiodes, respectively. Specifically, the left phase difference detector may analyze the intensity of light that penetrates through the left main photodiode, and the right phase difference detector may analyze the intensity of light that penetrates through the right main photodiode. Therefore, image sensors in accordance with embodiments of the present invention may detect the phase difference of light by using only one pixel pair and thereby realize an auto-focus function.

The pixels and the pixel pairs in accordance with diverse embodiments of the present invention may include photodiodes that may sense infrared rays. Specifically, the buried photodiodes, which are to be described in the detailed description section of the present patent specification, may sense infrared rays and generate photocharges. Therefore, image sensors that include the pixels and the pixel pairs in accordance with the diverse embodiments of the present invention may be used as visible light image sensors, infrared ray image sensors, and image sensors for both visible light and infrared rays.

Other effects of the diverse embodiments of the present invention that are not described herein may be understood from the detailed description of the present specification. While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
a main photodiode formed in a substrate;
a first inter-layer dielectric layer formed over a lower surface of the substrate; and
phase difference detectors formed over the first inter-layer dielectric layer,
wherein the phase difference detectors include:
a left phase difference detector that is vertically overlapping and aligned with a left side region of the main photodiode; and
a right phase difference detector that is vertically overlapping and aligned with a right side region of the main photodiode.

2. The image sensor of claim 1, wherein the left phase difference detector includes a left bottom electrode, a left buried photodiode, and a left top electrode, and
wherein the right phase difference detector includes a right bottom electrode, a right buried photodiode, and a right top electrode.

3. The image sensor of claim 2, wherein each of the left and the right bottom electrodes includes metal.

4. The image sensor of claim 2, wherein each of the left and the right buried photodiodes includes a PIN photodiode.

5. The image sensor of claim 2, wherein each of the left and the right buried photodiodes has a curved upper surface.

6. The image sensor of claim 2, wherein each of the left and the right top electrodes includes a transparent conductor.

7. The image sensor of claim 2, wherein each of the left and the right top electrodes has a rim shape or a frame shape.

8. The image sensor of claim 2, wherein each of the left and the right top electrodes has a bar shape or an island shape.

9. The image sensor of claim 1, further comprising:
a left light guide formed in the first inter-layer dielectric layer vertically overlapping and aligned with the left phase difference detector, and
a right light guide formed in the first inter-layer dielectric layer vertically overlapping and aligned with the right phase difference detector.

10. The image sensor of claim 9, wherein each of the left and the right light guides includes a material having a higher refractive index than the first inter-layer dielectric layer.

11. The image sensor of claim 1, further comprising:
a left guide dam formed between the main photodiode and the left phase difference detector vertically overlapping and aligned with the left phase difference detector, and
a right guide dam formed between the main photodiode and the right phase difference detector vertically overlapping and aligned with the right phase difference detector.

12. The image sensor of claim 11, wherein each of the left and the right guide dams has a nm shape or a frame shape.

13. The image sensor of claim 11, wherein each of the left and the right guide dams includes an air gap.

14. The image sensor of claim 11, wherein each of the left and the right guide dams includes a material having a lower refractive index than the first inter-layer dielectric layer.

15. An image sensor, comprising:
a left main photodiode and a right main photodiode that are formed in a substrate;
a first inter-layer dielectric layer formed over a lower surface of the substrate; and
phase difference detectors disposed over the first inter-layer dielectric layer,
wherein the phase difference detectors include:
a left phase difference detector that is vertically overlapping and aligned with the left main photodiode; and
a right phase difference detector that is vertically overlapping and aligned with the right main photodiode.

16. The image sensor of claim 15, wherein the left phase difference detector includes a left bottom electrode, a left buried photodiode, and a left top electrode, and
wherein the right phase difference detector includes a right bottom electrode, a right buried photodiode, and a right top electrode.

17. The image sensor of claim 15, further comprising:
a left light guide that is vertically overlapping and aligned with a left side region of the left main photodiode and the left phase difference detector; and
a right light guide that is vertically overlapping and aligned with a right side region of the right main photodiode and the right phase difference detector.

18. An image sensor, comprising:
a main photodiode formed in a substrate;
a color filter formed over an upper surface of the substrate;
a first inter-layer dielectric layer formed over a lower surface of the substrate; and
a buried photodiode formed over the first inter-layer dielectric layer,
wherein the buried photodiode is vertically overlapping the main photodiode and aligned with a first sidewall of the main photodiode.

19. The image sensor of claim 18, further comprising:
a bottom electrode formed between the buried photodiode and the first inter-layer dielectric layer; and
a top electrode formed over the buried photodiode,
wherein the bottom electrode includes an opaque conductor, and
wherein the top electrode includes a transparent conductor.

20. The image sensor of claim 18, wherein the buried photodiode includes a stack of an N-type region, an intrinsic region, and a P-type region, and
wherein each of the N-type region, the intrinsic region, and the P-type region is formed of amorphous silicon or polycrystalline silicon.

* * * * *